(12) United States Patent
Matsuda

(10) Patent No.: US 11,292,035 B2
(45) Date of Patent: Apr. 5, 2022

(54) METHOD FOR CLEANING GAS SUPPLY LINE AND PROCESSING SYSTEM

(71) Applicant: TOKYO ELECTRON LIMITED, Tokyo (JP)

(72) Inventor: Risako Matsuda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 173 days.

(21) Appl. No.: 16/393,462

(22) Filed: Apr. 24, 2019

(65) Prior Publication Data

US 2019/0333742 A1 Oct. 31, 2019

(30) Foreign Application Priority Data

Apr. 25, 2018 (JP) .............................. JP2018-084251

(51) Int. Cl.
*B08B 9/02* (2006.01)
*B08B 7/00* (2006.01)
*H01J 37/32* (2006.01)
*H01L 21/311* (2006.01)
*H01L 21/027* (2006.01)
*B08B 9/027* (2006.01)

(52) U.S. Cl.
CPC ............ *B08B 7/0014* (2013.01); *B08B 9/027* (2013.01); *H01J 37/32449* (2013.01); *H01J 37/32495* (2013.01); *H01J 37/32522* (2013.01); *H01L 21/0276* (2013.01); *H01L 21/31116* (2013.01); *H01L 21/31138* (2013.01); *H01L 21/31144* (2013.01); *H01J 2237/332* (2013.01); *H01J 2237/3341* (2013.01)

(58) Field of Classification Search
CPC .................................................. B08B 7/0014
See application file for complete search history.

(56) References Cited

U.S. PATENT DOCUMENTS

2009/0238968 A1* 9/2009 Hatanaka ............ C23C 16/4402
427/237

FOREIGN PATENT DOCUMENTS

| JP | 5855644 B | 12/2015 |
|---|---|---|
| WO | 2006/101171 A1 | 9/2006 |
| WO | 2011/133207 A2 | 10/2011 |

* cited by examiner

*Primary Examiner* — Mikhail Kornakov
*Assistant Examiner* — Ryan L Coleman
(74) *Attorney, Agent, or Firm* — Weihrouch IP

(57) ABSTRACT

A method includes forming a film of a compound on an inner wall of a gas supply line by polymerization of a first compound and a second compound by controlling a temperature of the gas supply line to a first temperature at which the first compound and the second compound are polymerized in a state where a first gas containing the first compound and a second gas containing the second compound are supplied to the gas supply line, and removing the film by controlling the temperature of the gas supply line to a second temperature at which the film is depolymerized after predetermined processing is performed on a target object in a processing chamber by a processing gas supplied into the processing chamber through the gas supply line having the film. The first compound is isocyanate. The second compound is amine or a compound having a hydroxyl group.

4 Claims, 22 Drawing Sheets

METHOD FOR CLEANING GAS SUPPLY LINE AND PROCESSING SYSTEM

CROSS-REFERENCE TO RELATED APPLICATION

This application claims priority to Japanese Patent Application No. 2018-084251, filed on Apr. 25, 2018, the entire contents of which are incorporated herein by reference.

TECHNICAL FIELD

The present disclosure relates to a method for cleaning a gas supply line and a processing system.

BACKGROUND

In manufacturing semiconductor devices and the like, processing such as etching, film formation or the like is performed on a semiconductor wafer (hereinafter, referred to as "wafer") by using a processing gas. Since a flow rate of the processing gas greatly affects characteristics of the wafer after the processing, a high accuracy is required for a flow rate controller for controlling the flow rate of the processing gas. Therefore, the flow rate controller is periodically calibrated. The flow rate controller is calibrated by using, e.g., a volume of a gas supply line for supplying the processing gas into a processing chamber.

In the processing such as etching, film formation or the like, a highly corrosive gas such as a halogen-containing gas may be used. In that case, an inner wall of the gas supply line may be damaged by the processing gas. Therefore, there is known a technique of coating the inner wall of the gas supply line with a material having resistance to a halogen-containing processing gas (see, e.g., Japanese Patent No. 5855644).

Some processing gases may react with moisture or a residual gas in the gas supply line and generate a solid in the gas supply line. For example, if $NH_3$ gas and $Cl_2$ gas exist in the gas supply line, $NH_4Cl$ may be generated in the gas supply line. Such a solid is also generated in a flow rate controller, a valve or the like connected to the gas supply line. If a solid is generated in the gas supply line or the like, an error may occur in a control amount of the flow rate of the processing gas by the flow rate controller.

For example, in the case of calibrating the flow rate controller by a build-up method based on a volume of the gas supply line, the control amount of the flow rate may change due to the change in the volume of the gas supply line. In a flow rate controller for controlling the flow rate based on a difference in a pressure before and after an orifice, an opening of the orifice is narrowed by a generated solid and, thus, the control amount of the flow rate may change. In a thermal type flow rate controller, heat distribution in the pipe changes due to a solid material adhered to the inner wall of the pipe and, thus, the control amount of the flow rate may change.

The solid material generated in the gas supply line may grow and flow as particles into the gas supply line. Then, the solid material may be adhered to devices such as a valve and the like, thereby causing malfunction of the devices. In addition, the particles flowing in the gas supply line may enter the processing chamber and be adhered to the wafer, thereby causing defects.

SUMMARY

In accordance with an aspect of the present disclosure, there is provided a method for cleaning a gas supply line including forming a film and removing the film. In forming the film, a film of a compound on an inner wall of a gas supply line is formed by polymerization of a first compound and a second compound by controlling a temperature of the gas supply line to a first temperature in a state where a first gas containing the first compound and a second gas containing the second compound are supplied to the gas supply line. The first temperature is a temperature at which the first compound and the second compound are polymerized. In removing the film, the film is removed by controlling the temperature of the gas supply line to a second temperature at which the film is depolymerized after predetermined processing is performed on a target object in a processing chamber by a processing gas supplied into the processing chamber through the gas supply line having the film. The first compound is isocyanate and the second compound is amine or a compound having a hydroxyl group.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a method for cleaning a gas supply line and a processing system will be described in detail with reference to the accompanying drawings. The method for cleaning a gas supply line and the processing system of the present disclosure are not limited by the following embodiments.

(Configuration of Processing System 1)

Figure 1:
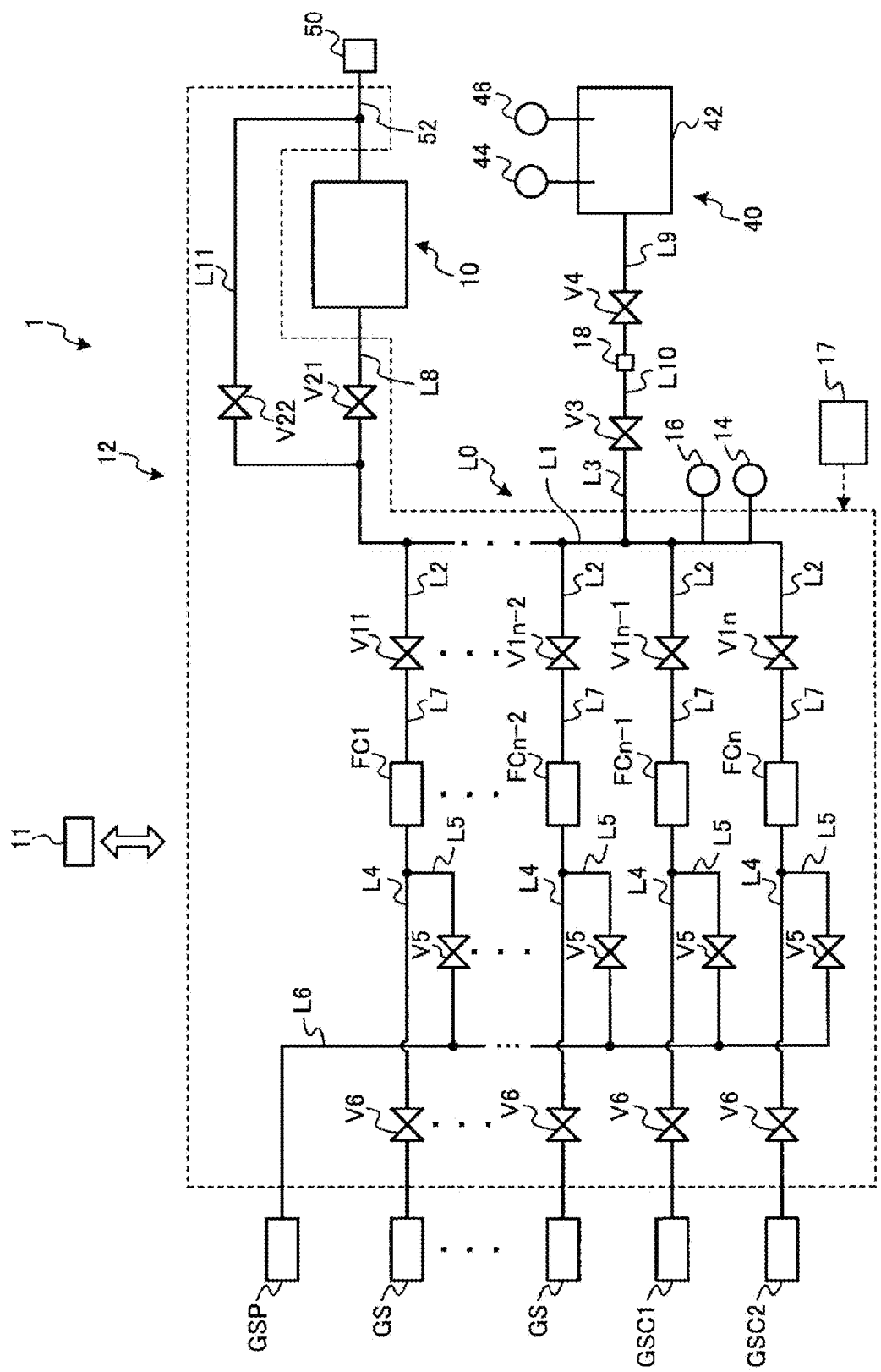
FIG. 1 shows an exemplary configuration of a processing system according to an embodiment.

FIG. 1 shows an exemplary configuration of a processing system 1 according to an embodiment of the present disclosure. As shown in FIG. 1, the processing system 1 includes, e.g., a plasma processing apparatus 10, a control unit 11, and a piping system 12. The piping system 12 includes a plurality of flow rate controllers FC1 to FCn (n being an integer of 2 or more), a plurality of valves V11 to V1n, valves V21 and V22, and a valve V3. In the following description, the flow rate controllers FC1 to FCn are collectively referred to as "flow rate controller FC", and the valves V11 to V1n are collectively referred to as "valve V1." Further, the pipes in the piping system 12 are collectively referred to as "pipe L." The piping system 12 is an example of a gas supply line.

Gas sources are connected to input ends of the flow rate controllers FC through valves V6 and pipes L4. In the example shown in FIG. 1, a gas source GS is connected to the flow rate controllers FC1 to FCn−2 through the valves V6 and the pipes L4. A gas source GSC1 is connected to the flow rate controller FCn−1 through the valve V6 and the pipe L4. A gas source GSC2 is connected to the flow rate controller FCn through the valve V6 and the pipe L4. The pipes L4 are connected to input ends of valves V5 through pipes L5. Output ends of the valves V5 are connected to the gas source GSP through a pipe L6.

The gas source GSP supplies a purge gas such as a nitrogen gas or the like. Each of the gas sources GS supplies a processing gas used for performing processing such as etching or the like on the wafer W in the plasma processing apparatus 10. The processing gas may be, e.g., an aminosilane-based gas containing an organic metal compound, a fluorocarbon-based gas, a gas having an oxygen atom and a carbon atom (e.g., carbon dioxide gas or the like), a nitrogen gas, a hydrogen-containing gas, a rare gas, or the like. The fluorocarbon-based gas can be expressed as, e.g., $C_xF_y$ gas (x and y being integers of 1 to 10). The fluorocarbon-based gas may be, e.g., $CF_4$ gas, $C_4F_6$ gas, $C_4F_8$ gas or the like. The rare gas may be, e.g., Ar gas, He gas, or the like.

The gas source GSC1 supplies a first gas containing a first compound. The gas source GSC2 supplies a second gas containing a second compound. The first compound, which is a raw material monomer, is isocyanate. The second compound, which is a raw material monomer, is amine or a compound having a hydroxyl group. The gas source GSC1 is an example of a first gas source and the gas source GSC2 is an example of a second gas source.

In the present embodiment, the first gas and the second gas are supplied into the piping system 12. Then, the temperature of the piping system 12 is controlled to a temperature at which the first compound and the second compound are polymerized. Accordingly, a film of an organic compound is formed on the inner wall of the pipe L, the flow rate controller FC, the valve V, or the like in the piping system 12. When the second compound is amine, the compound forming the film may be oligomer or polymer having a urea bond. When the second compound is a compound having a hydroxyl group, the compound forming the film may be oligomer or polymer having a urethane bond.

The polymerization of the first compound and the second compound occurs at a temperature lower than the temperature at which the compounds forming the film are deposited. The polymerization of the first compound and the second compound occurs within a temperature range of, e.g., 0° C. to 150° C.

Hereinafter, examples of the first compound, the second compound, and the compound forming the film will be described. As for the first compound, monofunctional isocyanate shown in the following formula (1) or bifunctional isocyanate shown in the following formula (2) may be used. In the formulas (1) and (2), R represents an alkyl group (linear alkyl group or cyclic alkyl group) or an aryl group. As for the isocyanate that is the first compound, an aliphatic compound or an aromatic compound can be used, for example. As for the aliphatic compound, an aliphatic chain compound or an aliphatic cyclic compound can be used. The aliphatic compound may include, e.g., hexamethylene diisocyanate. The aliphatic cyclic compound may include, e.g., 1,3-bis (isocyanatomethyl) cyclohexane (H6XDI).

(Formula 1)

OCN—R  (1)

(Formula 2)

OCN—R—NCO  (2)

As for the second compound, monofunctional amine shown in the following formula (3) or bifunctional amines shown in the following formula (4) may be used. In the formulas (3) and (4), R represents an alkyl group (linear alkyl group or a cyclic alkyl group) or an aryl group. The atomic group of the first compound polymerized with the second compound, which is the atomic group represented by R in the formula (1) or (2), may be the same as or different from the atomic group of the second compound polymerized with the first compound, which is the atomic group represented by R in the formula (3) or (4). As for the amine that is the second compound, an aliphatic compound or an aromatic compound may be used, for example. As for the aliphatic compound, an aliphatic chain compound or an aliphatic cyclic compound may be used. The aliphatic compound may include, e.g., 1,12-diaminododecane (DAD). The aliphatic cyclic compound may include 1,3-bis (aminomethyl) cyclohexane (H6XDA). The amine that is the second compound may be secondary amine.

(Formula 3)

$H_2N—R$  (3)

(Formula 4)

$H_2N—R—NH_2$  (4)

As for the second compound, a monofunctional compound having a hydroxyl group shown in the following formula (5) or a bifunctional compound having a hydroxyl group shown in the formula (6) may be used. In the formulas (5) and (6), R represents an alkyl group (linear alkyl group or cyclic alkyl group) or an aryl group. The atomic group of the first compound polymerized with the second compound, which is the atomic group represented by R in the formula (1) or (2), may be the same as or different from the atomic group of the second compound polymerized with the first compound, which is the atomic group represented by R in the formula (5) or (6). The compound having a hydroxyl group is alcohol or phenol. As for the alcohol that is the second compound, diethylene glycol, and 1,2-cyclohexane diol may be used, for example. As for the phenol that is the second compound, hydroquinone, and 1,2,4-trihydroxybenzene may be used, for example.

(Formula 5)

  (5)

(Formula 6)

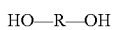  (6)

As for the compound forming the film, compounds having a urea bond shown in the following formulas (7) to (10) may be used. The compound shown in the formula (7) is generated by polymerization of the compound shown in the formula (1) and the compound shown in the formula (3). The compound shown in the formula (8) is generated by polymerization of the compound shown in the formula (1) and the compound shown in the formula (4). Alternatively, the compound shown in the formula (8) is generated by polymerization of the compound shown in the formula (2) and the compound shown in the formula (3). The compound shown in the formula (9) is generated by polymerization of the compound shown in the formula (2) and the compound shown in the formula (4). The compound shown in the formula (10) has a structure in which both ends of the polymer shown in the formula (9) are terminated with a monomer having an isocyanate group (e.g., the compound shown in the formula (1)) and a monomer having an amino group (e.g., the compound shown in the formula (3)). In the formulas (9) and (10), n is an integer of 2 or more.

(Formula 7)

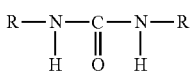  (7)

(Formula 8)

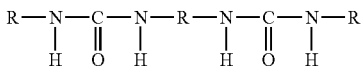  (8)

(Formula 9)

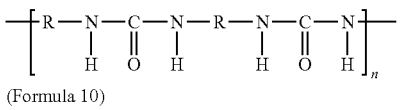  (9)

(Formula 10)

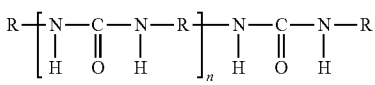  (10)

As for another compound forming the film, compounds having a urethane bond shown in the following formulas (11) to (15) may be used. The compound shown in the formula (11) is generated by polymerization of the compound shown in the formula (1) and the compound shown in the formula (5). The compound shown in the formula (12) is generated by polymerization of the compound shown in the formula (1) and the compound shown in the formula (6). The compound shown in the formula (13) is generated by polymerization of the compound shown in the formula (2) and the compound shown in the formula (5). The compound shown in the formula (14) is generated by polymerization of the compound shown in the formula (2) and the compound shown in the formula (6). The compound shown in the formula (15) has a structure in which both ends of the polymer shown in the formula (14) are terminated with a monomer having an isocyanate group (e.g., the compound shown in the formula (1)) and a monomer having a hydroxyl group (e.g., the compound shown in the formula (5)). In the formulas (14) and (15), n is an integer of 2 or more.

(Formula 11)

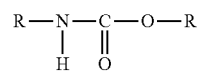  (11)

(Formula 12)

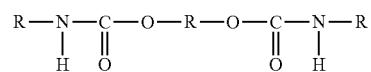  (12)

(Formula 13)

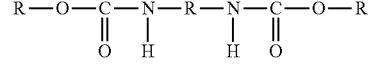  (13)

(Formula 14)

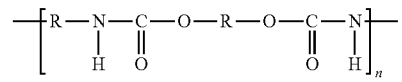  (14)

(Formula 15)

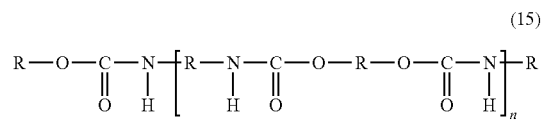  (15)

The following formulas (16) to (26) exemplify the structure of the atomic group represented by R in the formulas (2), (4) and (6). In the formulas (16) to (26), R1 is an isocyanate group, an amino group, or a hydroxyl group. As shown in the formulas (16) to (22), each of the first compound and the second compound may have a benzene ring as an atomic group represented by R. Each of the compounds represented by formulas (16) to (19) does not have carbon between an isocyanate group, an amino group, or a hydroxyl group and a benzene ring. Each of the compounds represented by formulas (20) to (22) has carbon between an isocyanate group, an amino group, or a hydroxyl group and a benzene ring. As shown in the formulas (23) and (24), each of the first compound and the second compound may have an alicyclic hydrocarbon as an atomic group represented by R. Further, as shown in the formulas (25) and (26), in each of the first compound and the second compound, the atomic group represented by R may be constituted by an aliphatic group.

(Formula 16)

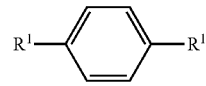  (16)

-continued (Formula 17)

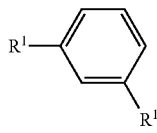

(17)

(Formula 18)

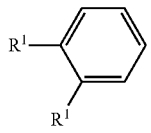

(18)

(Formula 19)

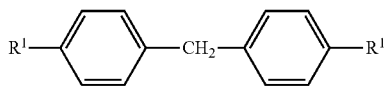

(19)

(Formula 20)

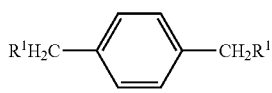

(20)

(Formula 21)

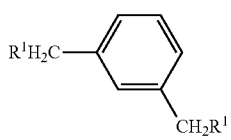

(21)

(Formula 22)

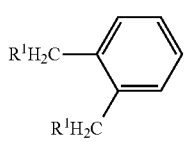

(22)

(Formula 23)

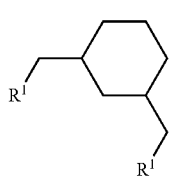

(23)

(Formula 24)

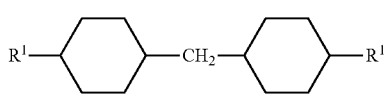

(24)

(Formula 25)

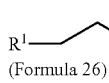

(25)

(Formula 26)

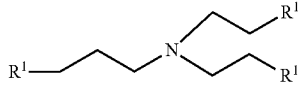

(26)

The input ends of the valves V1 are connected to output ends of the flow rate controllers FC through pipes L7. The output ends of the valves V1 are connected to a main pipe L1 through branch pipes L2. In the example shown in FIG. 1, an output end of a k-th flow rate controller FC among the n number of flow rate controllers FC is connected to the main pipe L1 through a k-th valve V1 among the n number of valves V1.

The pipe L0 includes the main pipe L1, the branch pipes L2, and a connection pipe L3. An end portion of a downstream side of the main pipe L1 is connected to input ends of the valves V21 and V22. An output end of the valve V21 is connected to the plasma processing apparatus 10 through a pipe L8. In other words, the end portion of the downstream side of the main pipe L1 is connected to the plasma processing apparatus 10 through the valve V21 and the pipe L8. An output end of the valve V22 is connected to a gas exhaust line 52 that connects the plasma processing apparatus 10 and a gas exhaust unit 50. The upstream side of the main pipe L1 is connected to the branch pipes L2.

One end of the connection pipe L3 is connected to the main pipe L1, and the other end of the connection pipe L3 is connected to an input end of the valve V3. One end of the connection pipe L3 may be connected to one of the branch pipes L2. An output end of the valve V3 is connected to one end of the pipe L10, and the other end of the pipe L10 is provided with a joint portion 18. A reference device 40 is connected to the joint portion 18. The reference device 40 includes a tank 42, a pressure sensor 44, a temperature sensor 46, a pipe L9, and a valve V4. The tank 42 is provided with the pipe L9, and the valve V4 is provided in the pipe L9. The pressure sensor 44 and the temperature sensor 46 are connected to the tank 42. The joint portion 18 can be connected to the tank 42 through the pipe L9 and the valve V4.

The piping system 12 is provided with a pressure sensor 14 for detecting a pressure of a gas in the pipe L0 and a temperature sensor 16 for detecting a temperature of the gas in the pipe L0. In the present embodiment, the pressure sensor 14 and the temperature sensor 16 are provided in the main pipe L1. The pressure sensor 14 and the temperature sensor 16 may be provided in the connection pipe L3 or one of the branch pipes L2.

A temperature control unit 17 controls the temperature of the piping system 12 under the control of the control unit 11. The gas sources GSP, GS, GSC1 and GSC2 may include a gas source that generates a gas by vaporizing a liquid material at a room temperature. The temperature control unit 17 controls the temperature of the piping system 12 to a temperature at which a gas can maintain a gaseous state. Accordingly, even a material that is in a liquid state at a room temperature can circulate in a vaporized state through the piping system 12.

The control unit 11 includes a processor, a memory, and an input/output interface. The memory stores programs executed by the processor and recipes including processing conditions and the like. The processor executes the program read from the memory and controls the respective components of the plasma processing apparatus 10 and the piping system 12 via the input/output interface based on the recipe stored in the memory. Accordingly, the control unit 11 executes predetermined processing such as etching or the like on the wafer W in the plasma processing apparatus 10 by gases supplied from the gas sources into the plasma processing apparatus 10. Further, the control unit 11 executes cleaning for removing reaction by-products (deposits) adhered to the inner wall of the pipes or the like in the piping system 12.

(Configuration of Plasma Processing Apparatus 10)

Figure 2:
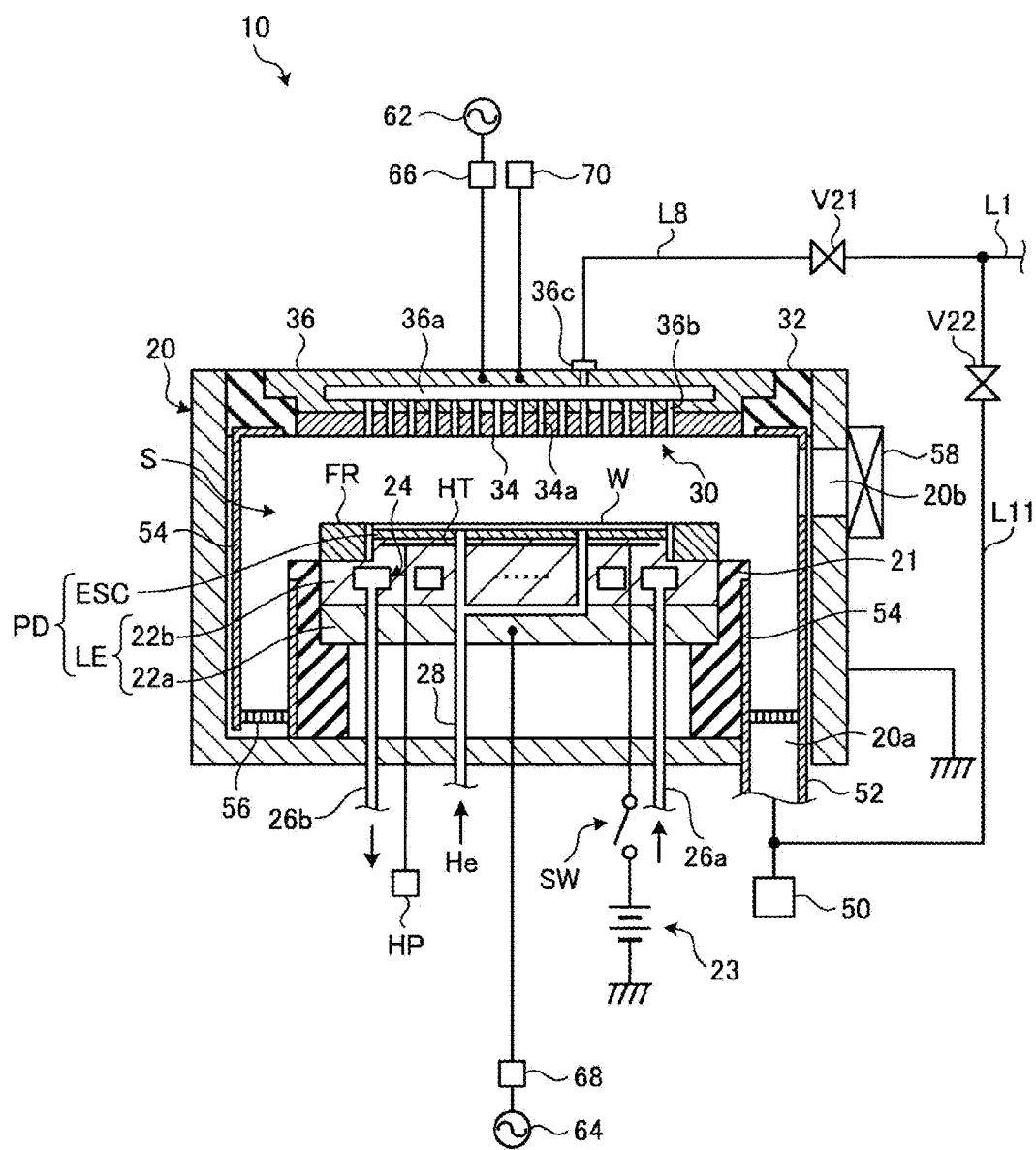
FIG. 2 is a cross sectional view showing a schematic example of a plasma processing apparatus.

FIG. 2 is a cross-sectional view showing a schematic example of the plasma processing apparatus 10. The plasma processing apparatus 10 of the present embodiment includes parallel plate electrodes. The plasma processing apparatus 10 includes a substantially cylindrical processing chamber 20. The processing chamber 20 is made of, e.g., aluminum or the like, and anodic oxidation treatment is performed on an inner wall surface thereof. The processing chamber 20 is frame grounded.

A substantially cylindrical supporting member 21 made of an insulating material such as quartz or the like is provided on a bottom portion of the processing chamber 20. In the processing chamber 20, the supporting member 21 extends vertically from the bottom portion of the processing chamber 20. A mounting table PD is provided in the processing chamber 20. The mounting table PD is supported by the supporting member 21.

The mounting table PD mounts thereon the wafer W that is an example of a target object. The mounting table PD includes an electrostatic chuck ESC and a lower electrode LE. The lower electrode LE includes a first plate 22a and a second plate 22b. The first plate 22a and the second plate 22b are formed in a substantially disc shape and made of a metal such as aluminum or the like. The second plate 22b is provided on the first plate 22a. The first plate 22a and the second plate 22b are electrically connected to each other.

The electrostatic chuck ESC is provided on the second plate 22b. The electrostatic chuck ESC has a structure in which an electrode made of a conductive film is embedded between two insulating layers or two insulating sheets. A DC power supply 23 is electrically connected to the electrode of the electrostatic chuck ESC via a switch SW. The electrostatic chuck ESC attracts the wafer W on an upper surface of the electrostatic chuck ESC by an electrostatic force such as a Coulomb force generated by a DC voltage applied from the DC power supply 23 via the switch SW. Accordingly, the wafer W can be held on the upper surface of the electrostatic chuck ESC.

A focus ring FR is provided on a peripheral portion of the second plate 22b to surround the edge of the wafer W and the electrostatic chuck ESC. The focus ring FR improves the uniformity of the processing such as etching or the like performed on the wafer W. The focus ring FR is made of a material appropriately selected depending on a material of a film to be processed. For example, the focus ring FR can be made of, e.g., quartz.

A flow path 24 for circulating a coolant is provided in the second plate 22b. A coolant is supplied to the flow path 24 from a chiller unit (not shown) provided outside the processing chamber 20 through a pipe 26a. The coolant supplied to the flow path 24 is returned to the chiller unit through a pipe 26b. The control unit 11 controls the chiller unit to control the temperature of the coolant, thereby cooling the second plate 22b to a predetermined temperature.

A heater HT as a heating element is provided on the second plate 22b. A heater power supply HP is connected to the heater HT. When power is supplied from the heater power source HP to the heater HT, the second plate 22b is heated. The temperature of the wafer W on the electrostatic chuck ESC is controlled to a predetermined temperature via the electrostatic chuck ESC by the cooling of the coolant circulating in the flow path 24 and the heating using the heater HT. The heater HT may be provided in the electrostatic chuck ESC.

The plasma processing apparatus 10 is further provided with a pipe 28 through which a heat transfer gas, e.g., He gas or the like, is supplied. The heat transfer gas supplied through the pipe 28 is supplied between the upper surface of the electrostatic chuck ESC and the backside of the wafer W. The control unit 11 controls a pressure of the heat transfer gas supplied to a gap between the upper surface of the electrostatic chuck ESC and the backside of the wafer W, thereby controlling thermal conductivity between the electrostatic chuck ESC and the wafer W.

The plasma processing apparatus 10 includes an upper electrode 30. The upper electrode 30 is disposed above the mounting table PD to face the mounting table PD. The lower electrode LE and the upper electrode 30 are provided substantially in parallel to each other. A space between the upper electrode 30 and the lower electrode LE serves as a processing space S in which plasma for processing the wafer W is generated.

The upper electrode 30 is supported at an upper portion of the processing chamber 20 via an insulating member 32 such as quartz or the like. The upper electrode 30 includes an electrode plate 34 and an electrode holder 36. The electrode plate 34 is made of, e.g., a silicon-containing material. A bottom surface of the electrode plate 34 faces the processing space S. The electrode plate 34 is provided with a plurality of gas injection holes 34a.

The electrode holder 36 is made of a conductive material, e.g., aluminum or the like, and detachably holds the electrode plate 34. The electrode holder 36 may have a water-cooling structure. A gas diffusion space 36a is provided in the electrode holder 36. A plurality of gas holes 36b communicating with the gas injection holes 34a extends downward from the gas diffusion space 36a. A gas inlet port 36c for introducing a processing gas to the gas diffusion space 36a is formed at the electrode holder 36. A pipe L8 is connected to the gas inlet port 36c. The pipe L8 is connected to the main pipe L1 via the valve V21.

In the processing chamber 20, a deposition shield 54 is detachably provided along an inner wall of the processing chamber 20. The deposition shield 54 is also provided at an outer periphery of the supporting member 21. The deposition shield 54 may be formed by coating ceramic such as $Y_2O_3$ or the like on an aluminum base material, for example.

At a lower portion of the processing chamber 20, a gas exhaust plate 56 is provided between the supporting member 21 and a sidewall of the processing chamber 20. The gas exhaust plate 56 may be formed by coating ceramic such as $Y_2O_3$ or the like on an aluminum base material. A gas exhaust port 20a is provided below the gas exhaust plate 56 in the processing chamber 20. The gas exhaust unit 50 is connected to the gas exhaust port 20a through the gas exhaust line 52. The valve V22 is connected to the gas exhaust line 52 through a pipe L11. The gas exhaust unit 50 includes a vacuum pump such as a turbo molecular pump or the like, and thus can decrease a pressure in the processing chamber 20 to a desired vacuum level. An opening 20b through which the wafer W is loaded and unloaded is provided at the sidewall of the processing chamber 20. The opening 20b can be opened and closed by a gate valve 58.

The plasma processing apparatus 10 includes a first high frequency power supply 62 and a second high frequency power supply 64. The first high frequency power supply 62 generates a first high frequency power for plasma generation, which has a frequency of 27 MHz to 100 MHz, e.g., 60

MHz in one example. The first high frequency power supply 62 is connected to the upper electrode 30 via a matching unit 66. The matching unit 66 is a circuit for matching an output impedance of the first high frequency power supply 62 and an input impedance of a load (upper electrode 30) side. The first high frequency power supply 62 may be connected to the lower electrode LE via the matching unit 66.

The second high frequency power supply 64 generates a second high frequency power for attracting ions to the wafer W, i.e., a high frequency bias power, which has a frequency of 400 kHz to 13.56 MHz, e.g., 13.56 MHz in one example. The second high frequency power supply 64 is connected to the lower electrode LE via a matching unit 68. The matching unit 68 is a circuit for matching an output impedance of the second high frequency power supply 64 and an input impedance on the load (lower electrode LE) side.

The plasma processing apparatus 10 includes a power supply 70. The power supply 70 is connected to the upper electrode 30. The power supply 70 applies to the upper electrode 30 a voltage for attracting positive ions in the processing space S to the electrode plate 34. In one example, the power supply 70 is a DC power supply for generating a negative DC voltage. When such a voltage is applied from the power supply 70 to the upper electrode 30, positive ions in the processing space S collide with the electrode plate 34. Accordingly, secondary electrons or silicon atoms, or both of the secondary electrons and the silicon atoms are emitted from the electrode plate 34.

The gas exhaust device 50, the first high frequency power supply 62, the matching device 66, the second high frequency power supply 64, the matching device 68, the power supply 70, the heater power supply HP, the switch SW, the chiller unit and the like are controlled by the control unit 11.

(Processing Performed by the Processing System 1)

Figure 3:
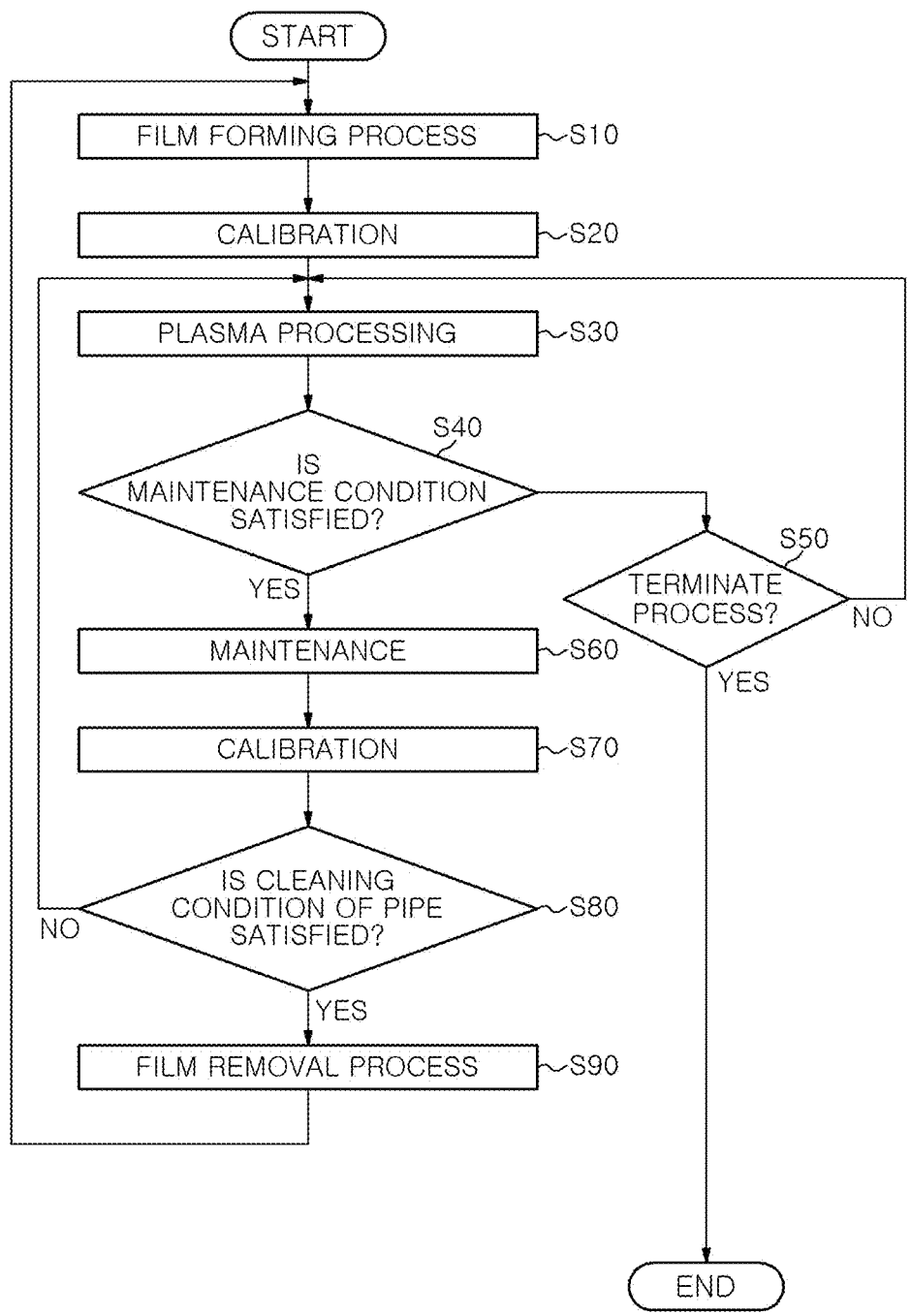
FIG. 3 is a flowchart showing an example of a process executed by a processing system.

FIG. 3 is a flowchart showing an example of a process performed by the processing system 1.

First, a film forming process for forming a film of an organic compound is performed on the inner walls of the pipe L, the flow rate controller FC, and the valve V in the piping system 12 (step S10). The film forming process is an example of a film forming step.

Next, the flow rate controllers FC are calibrated by using the pipe L having the film formed on the inner wall thereof (step S20). In the step S20, the volume in the pipe L0 is measured, for example.

Next, plasma processing such as etching or the like is performed on the wafer W loaded into the plasma processing apparatus 10 (step S30). By executing the step S30, deposits are adhered to the films formed on the inner walls of the pipe L, the flow rate controller FC, and the valve V through which the processing gas flows. The step S30 is an example of a processing step.

Next, the control unit 11 determines whether or not maintenance conditions are satisfied (step S40). The maintenance conditions include, e.g., whether or not the plasma processing has been performed on a predetermined number of wafers W, whether or not the accumulated time of the plasma processing has reached a predetermined period of time, and the like.

When the maintenance conditions are not satisfied (step S40: No), the control unit 11 determines whether or not the processing of the wafer W is terminated (step S50). When the processing of the wafer W is not terminated (step S50: No), the plasma processing shown in the step S30 is executed again. On the contrary, when the processing of the wafer W is terminated (step S50: Yes), the processing shown in the flowchart of FIG. 3 is terminated. When the processing of the wafer W is terminated, a film removal process in a step S90 to be described later may be executed.

When the maintenance conditions are satisfied (step S40: Yes), the maintenance such as cleaning in the plasma processing apparatus 10, replacement of consumable components in the plasma processing apparatus 10, or the like is performed (step S60).

Next, the flow rate controllers FC are calibrated (step S70). The calibration in the step S70 is the same as that in the step S20. In the calibration in the step S70, the volume in the pipe L0 is measured, for example.

Next, the control unit 11 determines whether or not cleaning conditions of the pipe L are satisfied (step S80). The step S80 is an example of a determination step. The cleaning conditions of the pipe L are determined by, e.g., whether absolute criteria or relative criteria are satisfied. The absolute criteria include, e.g., whether or not a predetermined period of time has elapsed from the previous cleaning of the pipe L, whether or not a predetermined number of wafers W have been processed from the previous cleaning of the pipe L, and the like. The relative criteria include, e.g., whether or not the difference between the capacity of the pipe L0 measured in the step S20 and the capacity of the pipe L0 measured in the step S70 is greater than or equal to a predetermined value, and the like.

When the cleaning conditions of the pipe L are not satisfied (step S80: No), the plasma processing shown in the step S30 is executed again. On the contrary, when the cleaning conditions of the pipe L are satisfied (step S80: Yes), the film removal process for removing the film formed on the inner wall of the pipe L or the like in the step S10 is performed (step S90). Accordingly, the film and deposits adhered to the film are removed. Then, by executing the step S10 again, a film of an organic compound is formed on the inner walls of the pipe L or the like. The film removal process is an example of a removal step.

(Film Forming Process)

Figure 4:
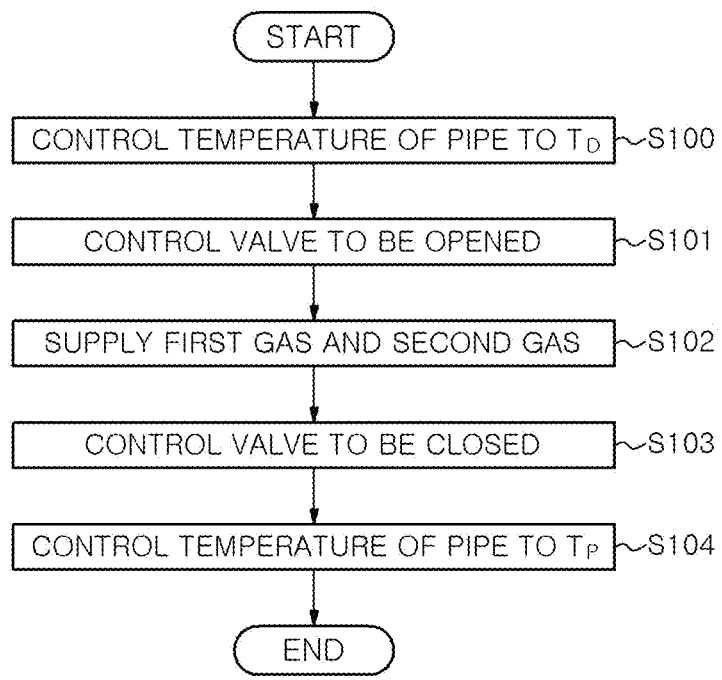
FIG. 4 is a flowchart showing an example of film forming process.
Figure 5:
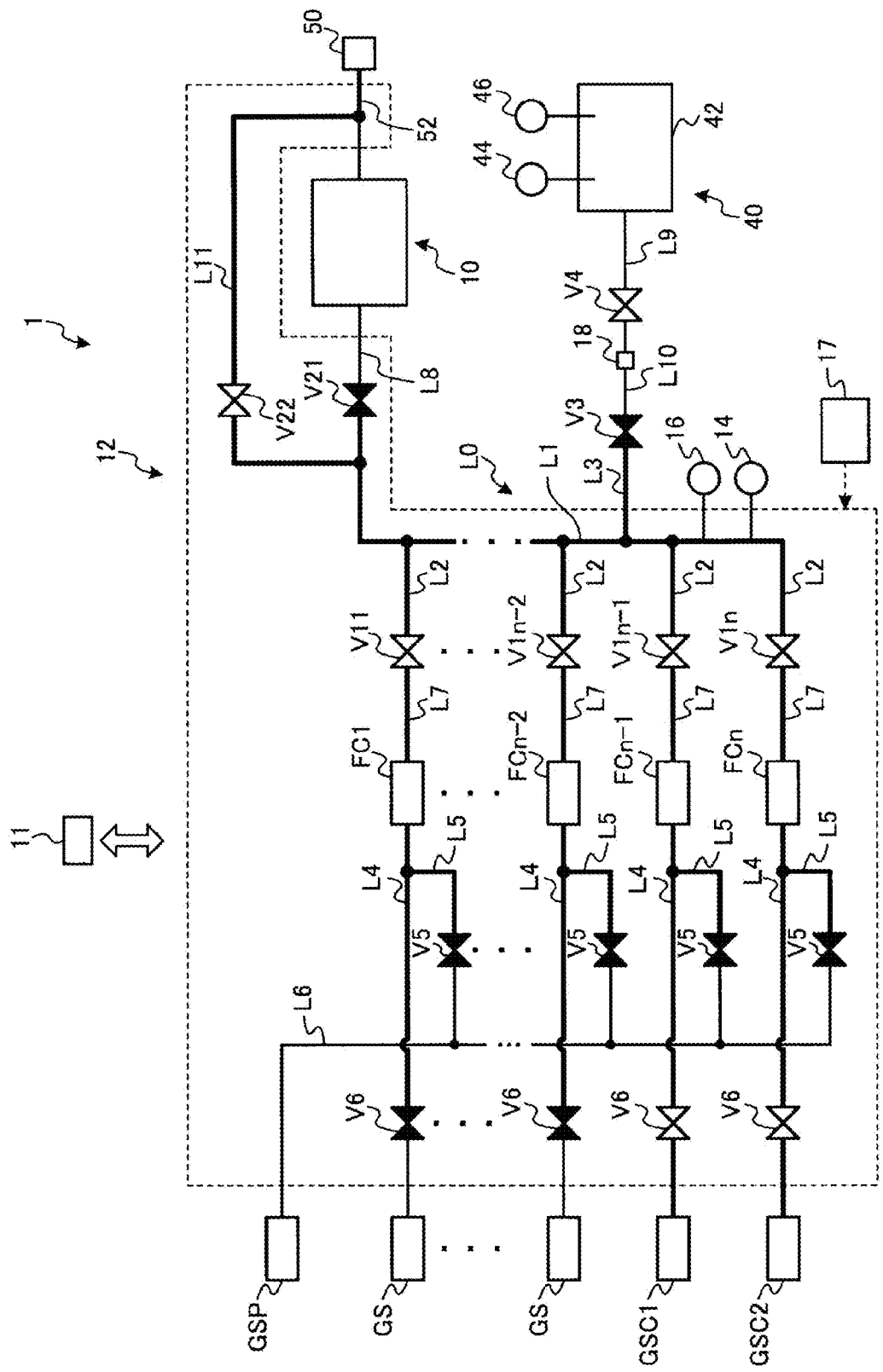
FIGS. 5 and 6 show examples of states of valves of the processing system.
Figure 6:
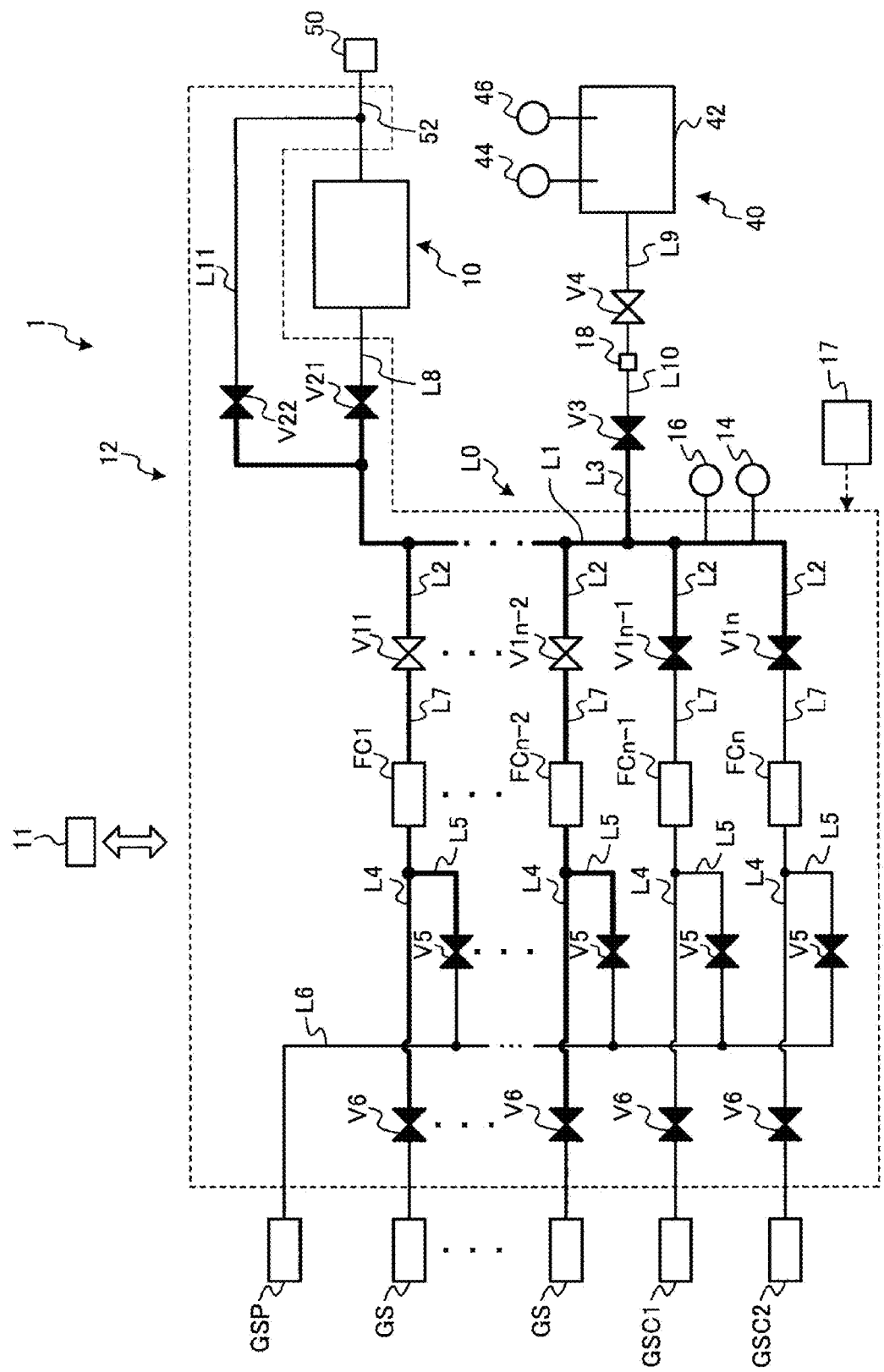

FIG. 4 is a flowchart showing an example of the film forming process (step S10). In the following description with reference to FIG. 4, FIGS. 5 and 6 will be appropriately referred to. FIGS. 5 and 6 show examples of the states of the valves of the processing system 1.

In the film forming process, first, a temperature of the piping system 12 is controlled to a predetermined temperature $T_D$ by the temperature control unit 17 (step S100). In the present embodiment, the predetermined temperature $T_D$ is a temperature at which the first compound contained in the first gas and the second compound contained in the second gas are not polymerized. For example, the predetermined temperature $T_D$ is a temperature at which a compound produced by polymerization of the first compound and the second compound is depolymerized. The compound produced by the polymerization of the first compound and the second compound is depolymerized at a temperature of, e.g., 200° C. to 350° C. The predetermined temperature $T_D$ is an example of a second temperature.

Then, the predetermined valve V is controlled to be opened (step S101). In the step S101, as shown in FIG. 5, for example, the valves V11 to V1n, the valve V22, and the valves V6 connected to the gas sources GSC1 and GSC2 are controlled to be opened. Further, the valves V21, V3 and V5, and the valves V6 connected to the gas sources GS are controlled to be closed. In FIG. 5, white valves V indicate the valves V controlled to be opened, and black valves V indicate the valves V controlled to be closed.

Next, the first gas is supplied from the gas source GSC1 into the piping system 12, and the second gas is supplied from the gas source GSC2 into the piping system 12 (step S102). The flow rate of the first gas is controlled by the flow rate controller FCn−1, and the flow rate of the second gas is controlled by the flow rate controller FCn. Then, the gas in the piping system 12 is exhausted by the gas exhaust unit 50. The flow rate controllers FC1 to FCn−2 are controlled to be opened. Accordingly, in the piping system 12, the first gas and the second gas fill the section indicated by bold lines in FIG. 5.

Next, the valves V1n−1, V1n, and V22 are controlled to be closed (step S103). Accordingly, in the piping system 12, the first gas and the second gas fill the section indicated by bold lines as shown in FIG. 6, for example.

Next, the temperature control unit 17 controls the temperature of the piping system 12 to a predetermined temperature $T_P$ (step S104). In the present embodiment, the predetermined temperature $T_P$ is a temperature at which the first compound contained in the first gas and the second compound contained in the second gas are polymerized. The predetermined temperature $T_P$ is an example of a first temperature. The first compound and the second compound are polymerized at a temperature of, e.g., 0° C. to 150° C.

Figure 7A:
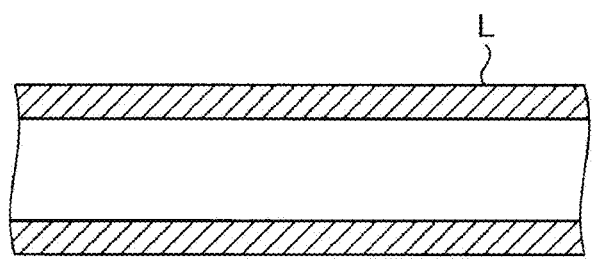
FIG. 7A shows an example of a cross section of a line before film formation.
Figure 7B:
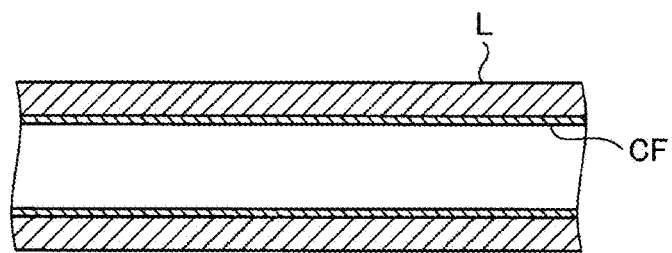
FIG. 7B shows an example of a cross section of the line after the film formation.

FIG. 7A shows an example of a cross section of a pipe L before film formation. FIG. 7B shows an example of the cross section of the pipe L after the film formation. In the pipe L having a state shown in FIG. 7A, for example, the inner wall of the pipe L is covered with a film CF of the compound as shown in FIG. 7B, for example, by executing the step S104. The film CF is also formed on the inner walls of the flow rate controllers FC1 to FCn−2 and the valves V11 to V1n−2.

Thereafter, the temperature control unit 17 controls the temperature of the piping system 12 to a temperature at which the compound produced by the polymerization of the first compound and the second compound is not depolymerized before the execution of the film removal process in the step S90. The compound produced by the polymerization of the first compound and the second compound is depolymerized at a temperature of, e.g., 200° C. and 350° C. Therefore, the temperature control unit 17 controls the temperature of the piping system 12 to be lower than 200° C. or higher than 350° C., for example. Preferably, the temperature control unit 17 controls the temperature of the piping system 12 to be lower than 200° C. so that gases supplied from the gas sources can be maintained in a gaseous state.

(Calibration)

Figure 8:
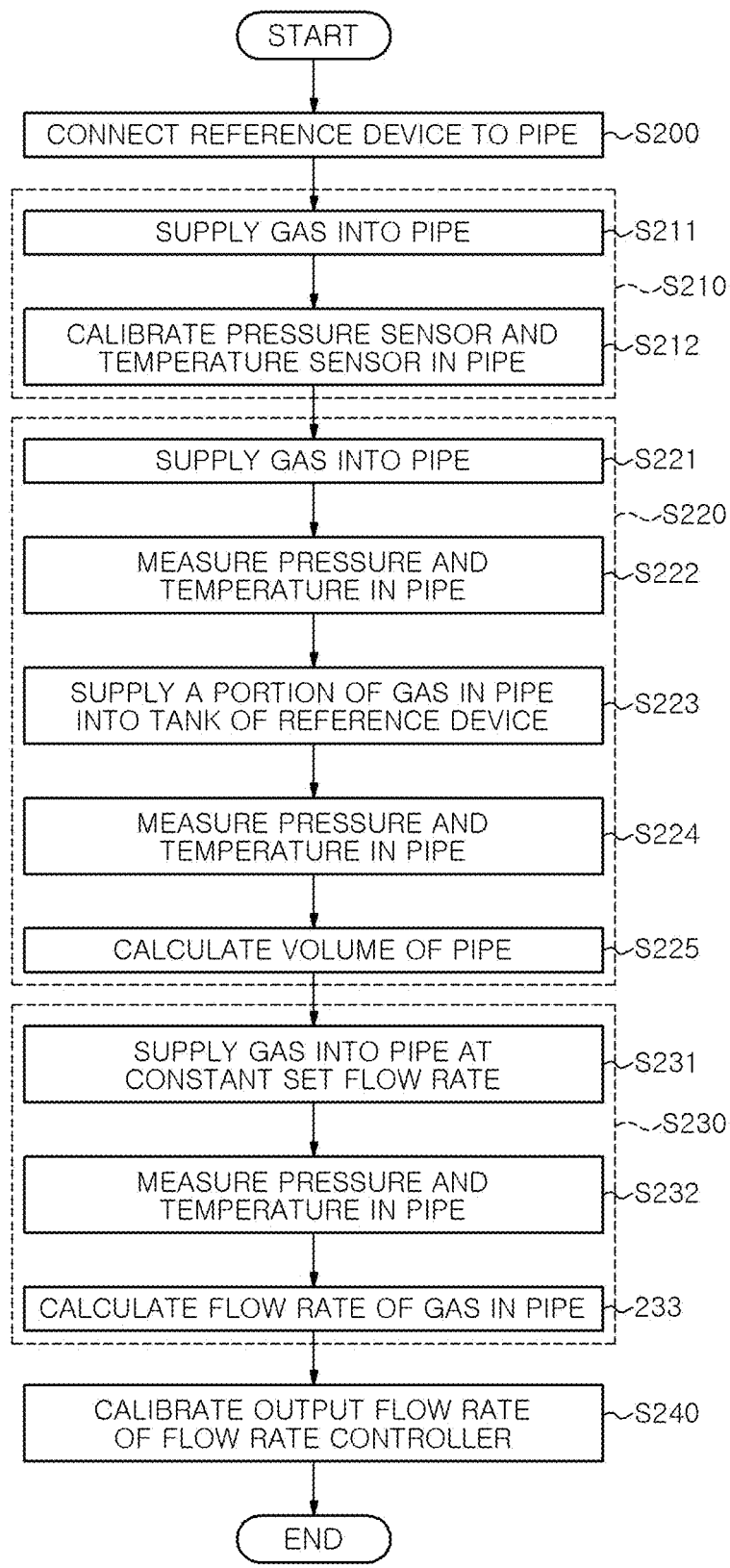
FIG. 8 is a flowchart showing an example of calibration.

FIG. 8 is a flowchart showing an example of calibration (step S20). Although the flowchart of FIG. 8 shows calibration of one flow rate controller FC, this is also applied to other flow rate controllers FC. The calibration in the step S70 is the same as that shown in FIG. 8.

In the calibration shown in FIG. 8, first, the reference device 40 is connected to the pipe L0 (step S200). Specifically, the reference device 40 is detachably connected to the connection pipe L3 through the pipe L10 and the valve V3 by connecting the pipe L9 of the reference device 40 to the joint portion 18.

Next, the pressure sensor 14 and the temperature sensor 16 provided in the pipe L0 are calibrated (step S210). The step S210 may be performed when the pressure sensor 14 and the temperature sensor 16 are used for the first time, or when a preset period of time has elapsed from the previous calibration. It is not necessary to execute the step S210 after the step S200. The step S210 includes steps S211 and S212.

Figure 9:
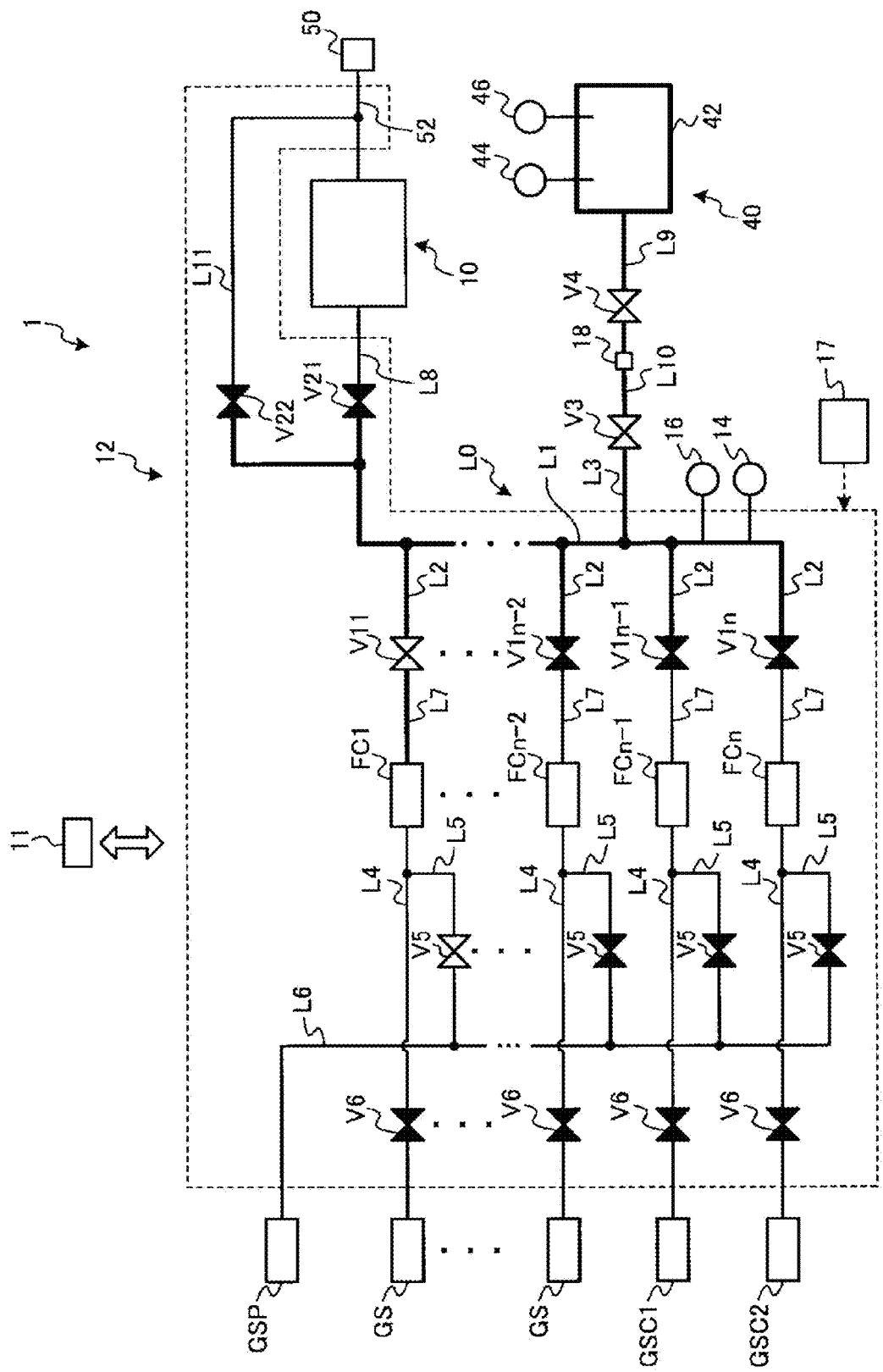
FIG. 9 schematically shows states of valves after execution of a step S211.

In the step S210, first, gas is supplied into the pipe L (step S211). In the step S211, the valves V11, V3, and V4 are controlled to be opened, and the valves V12 to V1n, V21, and V22 are controlled to be closed. Among the valves V5, the valve V5 connected to the flow rate controller FC1 through the pipe L5 is controlled to be opened, and the other valves V5 are controlled to be closed. Then, the gas from the gas source GSP is supplied into the pipe L0 through the flow rate controller FC1. FIG. 9 schematically shows the states of the valves V after the execution of the step S211. After the step S211 is executed, gases are stored in the pipe L0, the pipe L7 (connected to the flow rate controller FC1), the pipe L9, the pipe L10, and the tank 42 in the section indicated by bold lines in FIG. 9.

Next, the pressure sensor 14 and the temperature sensor 16 provided in the pipe L0 are calibrated (step S212). In the step S212, the valve V11 controlled to be opened in the step S211 is controlled to be closed. After the gases in the pipe L0 and the tank 42 are stabilized, the pressure sensor 14 and the temperature sensor 16 provided in the pipe L0 are calibrated based on measurement values of the pressure sensor 44 and the temperature sensor 46. This calibration is performed by adjusting measurement values of the pressure sensor 14 and the temperature sensor 16 to be equal to the measurement values of the pressure sensor 44 and the temperature sensor 46. After the step S212 is executed, the valve V22 may be controlled to be opened and the gas in the pipe L may be exhausted by the gas exhaust unit 50.

After the step S210 is executed, a step S220 is executed. In the step S220, the volume of the pipe L0 is calculated. The step S220 includes steps S221, S222, S223, S224, and S225.

Figure 10:
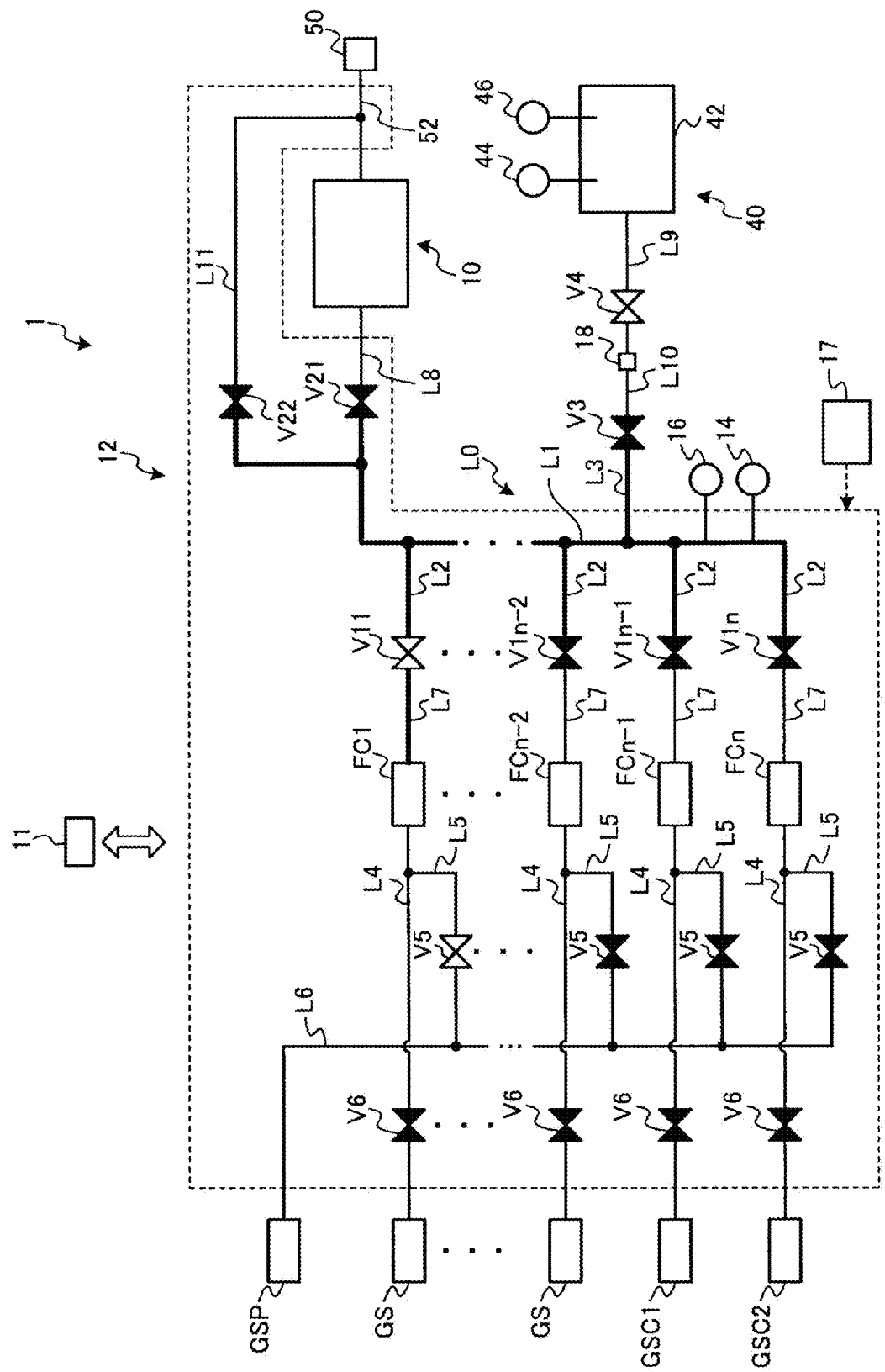
FIG. 10 schematically shows states of valves after execution of a step S221.

In the step S220, first, gas is supplied into the pipe L0 (step S221). In the step S221, the valves V11 and V4 are controlled to be opened, and the valves V12 to V1n, V21, V22, and V3 are controlled to be closed. Then, the gas from the gas source GSP is supplied into the pipe L0 through the flow rate controller FC1. FIG. 10 schematically shows the states of the valves V after the execution of the step S221. After the step S221 is executed, gases are stored in the pipe L0 and the pipe L7 (connected to the flow rate controller FC1) as indicated by bold lines in FIG. 10, for example.

Next, the pressure and the temperature in the pipe L0 are measured by the pressure sensor 14 and the temperature sensor 16 (step S222). In the step S222, the valve V11 controlled to be opened in the step S221 is controlled to be closed. After the gas in the pipe L0 is stabilized, measurement values of the pressure sensor 14 and the temperature sensor 16, i.e., a pressure and a temperature of the gas in the pipe L0, are obtained.

Figure 11:
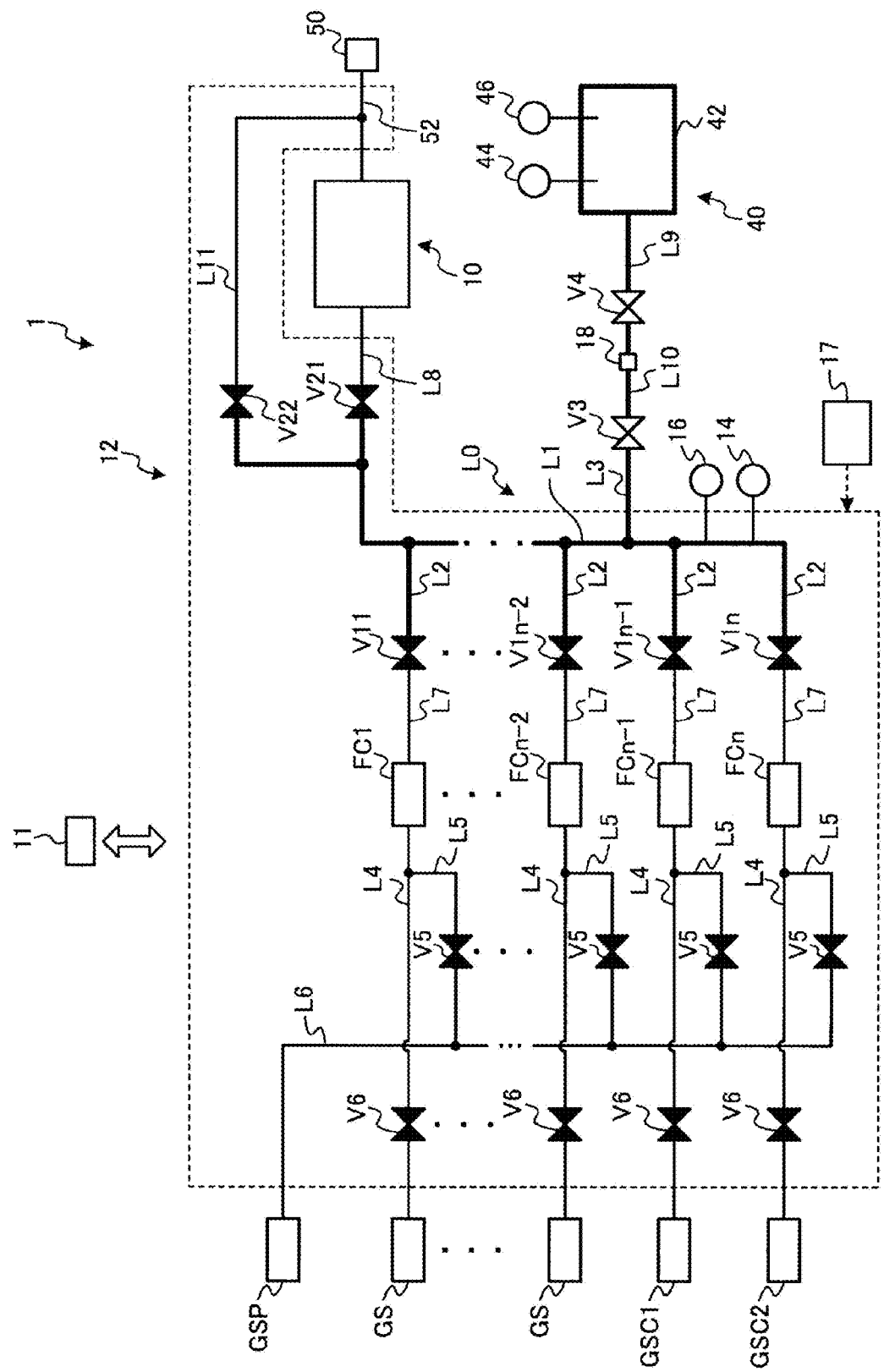
FIG. 11 schematically shows states of the valves after execution of a step S222.

Next, the gas in the pipe L0 is partially supplied into the tank 42 of the reference device 40 (step S223). In the step S223, the valve V3 is controlled to be opened, so that the gas in the pipe L0 is partially supplied into the tank 42. FIG. 11 schematically showing the states of the valves after the execution of the step S222. After the step S222 is executed, gases are stored in the pipe L0, the pipe L10, the pipe L9, and the tank 42, as indicated by bold lines in FIG. 11, for example.

Next, the pressure and the temperature in the pipe L0 are measured (step S224). In the step S224, after the gases in the pipe L0 and the tank 42 are stabilized, measurement values of the pressure sensor 14 and the temperature sensor 16, i.e., the pressure and the temperature of the gas in the pipe L0, are obtained. In the step S224, measurement values of the pressure sensor 44 and the temperature sensor 46, i.e., a pressure and a temperature of the gas in the tank 42, may be obtained instead of the measurement values of the pressure sensor 14 and the temperature sensor 16.

Next, volume of the pipe L0 is calculated (step S225). The control unit 11 stores the calculated volume of the pipe L0 in the memory. The step S225 is an example of a measurement step. Here, it is assumed that the pressure and the temperature in the pipe L0 measured in the step S222 are $P_1$ and $T_1$, respectively, and that the pressure and the temperature in the pipe L0 measured in the step S224 are $P_2$ and $T_2$, respectively. At this time, the measurement values have the relationship shown in the following Eq. (27) from the Boyle-Charles law. In the following Eq. (27), $V_{12}$ indicates the volume of the pipe L0, and $V_{42}$ indicates the volume of the closed space including the space in the tank 42. $V_{42}$ in the reference device 40 is a known value.

$$P_1 \cdot V_{12}/T_1 = P_2 \cdot (V_{12}+V_{42})/T_2 \qquad \text{Eq. (27)}$$

The control unit 11 calculates the volume $V_{12}$ of the pipe L0 by substituting the pressure $P_1$ and the temperature $T_1$ in the pipe L0 measured in the step S222 and the pressure $P_2$ and the temperature $T_2$ in the pipe L0 or in the tank 42 measured in the step S224 into the above Eq. (27). Then, the control unit 11 stores the calculated volume of the pipe L0 in the memory. After the step S220 is executed, the reference device 40 may be separated from the piping system 12. Further, after the step S220 is executed, the valve V22 may be controlled to be opened, and the gas in the piping system 12 may be exhausted by the gas exhaust unit 50.

After the step S220 is executed, a step S230 is executed. In the step S230, the flow rate of the gas flowing in the pipe L0 is calculated by a so-called build-up method. The step S230 includes steps S231, S232, and S233.

Figure 12:
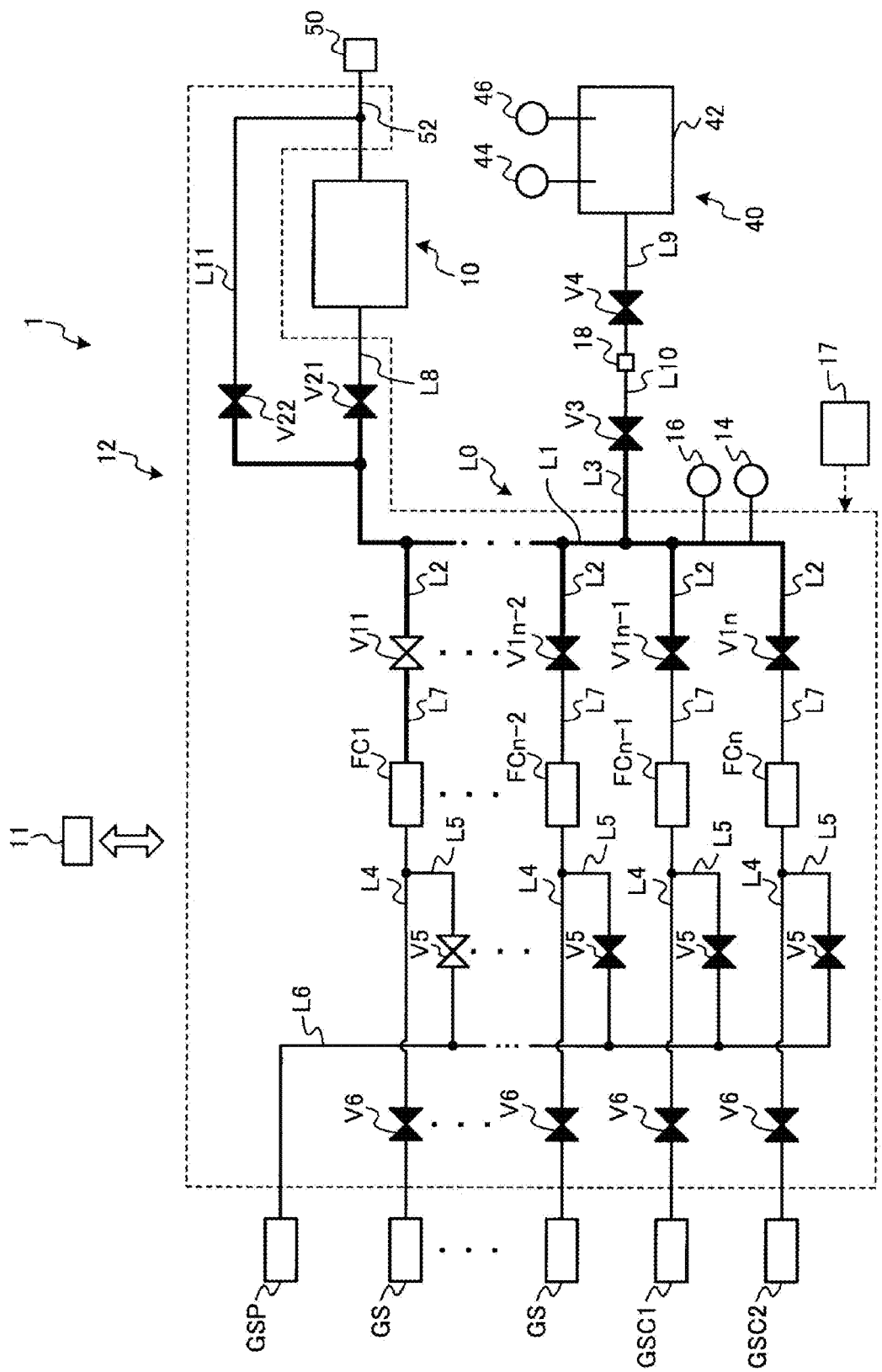
FIG. 12 schematically shows states of the valves after execution of a step S231.

In the step S230, first, gas is supplied into the pipe L0 at a constant set flow rate (step S231). In the step S231, the valves V11 and V22 are controlled to be opened, and the valves V12 to V1n, V21, V3, and V4 are controlled to be closed. Then, the gas from the gas source GSP is supplied to the pipe L0 at a constant set flow rate through the flow rate controller FC1. Then, the valve V22 is controlled to be closed. FIG. 12 schematically shows the states of the valves V after the execution of the step S231. After the step S231 is executed, gases are stored in the pipe L0 and the pipe L7 (connected to the flow rate controller FC 1) as indicated by bold lines in FIG. 12, for example.

Next, the pressure and the temperature in the pipe L0 are measured (step S232). In the step S232, measurement values of the pressure sensor 14 and the temperature sensor 16, i.e., a pressure and a temperature in the pipe L0, are obtained in a state where the gas from the gas source GSP is continuously supplied at a constant set flow rate into the pipe L0 through the flow rate controller FC1. The pressure and the temperature in the pipe L0 are measured at least twice. In the present embodiment, the first measurement is performed at a first time point $t_1$ in which the valve V22 is controlled to be closed, and the second measurement is performed at a second time point $t_2$ after time $\Delta t$ has elapsed from the first time point $t_1$.

Next, a flow rate of the gas in the pipe L0 is measured (step S233). In the step S233, an actual flow rate of the gas in the pipe L0 is calculated from the measurement result in the step S232. Specifically, a pressure rise rate $\Delta P/\Delta t$ in the pipe L0 with respect to time $\Delta t$ is calculated by dividing a difference $\Delta P$ between a pressure in the pipe L0 measured at the first time point $t_1$ and a pressure in the pipe L0 measured at the second time point $t_2$ by the time $\Delta t$ $(=t_2-t_1)$.

Then, the actual flow rate Q of the gas in the pipe L0 is calculated by substituting the pressure rise rate $\Delta P/\Delta t$, a volume $V_{L0}$ of the pipe L0, a volume $V_{L7}$ of the pipe L7, and a temperature T of the gas measured at the first time point $t_1$ or the second time point $t_2$ into the following Eq. (28). The volume $V_{L7}$ of the pipe L7 is a known value determined at the time of designing the piping system 12. In following Eq. (28), C is a constant.

$$Q=(\Delta P/\Delta t) \cdot (V_{L0}+V_{L7}) \cdot C/T \qquad \text{Eq. (28)}$$

Here, when it is assumed that the sum of the volume $V_{L0}$ of the pipe L0 and the volume $V_{L7}$ of the pipe L7 is $V_P$, the actual flow rate Q of the gas in the pipe L0 is expressed by the following Eq. (1-1). $V_p$ indicates the sum of the volume of the pipe L0 and the volume of the flow path communicating with the pipe L0 in a state where the valve V11 is controlled to be opened and the valves V12 to V1n, V21, V22, V3, and V4 are controlled to be closed.

$$Q=(\Delta P/\Delta t) \cdot V_P \cdot C/T \; Eq. \qquad (1\text{-}1)$$

After the step S233 is executed, the valve V22 may be controlled to be opened, and the gas in the piping system 12 may be exhausted by the gas exhaust unit 50.

After the step S230 is executed, a step S240 is executed. In the step S240, an output flow rate of the flow rate controller FC1 is calibrated based on the actual flow rate Q of the gas calculated in the step S230. The flow rate controller FC1 is calibrated by adjusting the set value of the flow rate of the flow rate controller FC1 to be equal to the actual flow rate Q of the gas calculated in the step S230. After the step S240 is executed, the valve V22 may be controlled to be opened, and the gas in the piping system 12 may be exhausted by the gas exhaust unit 50.

(Plasma Processing)

Figure 13A:
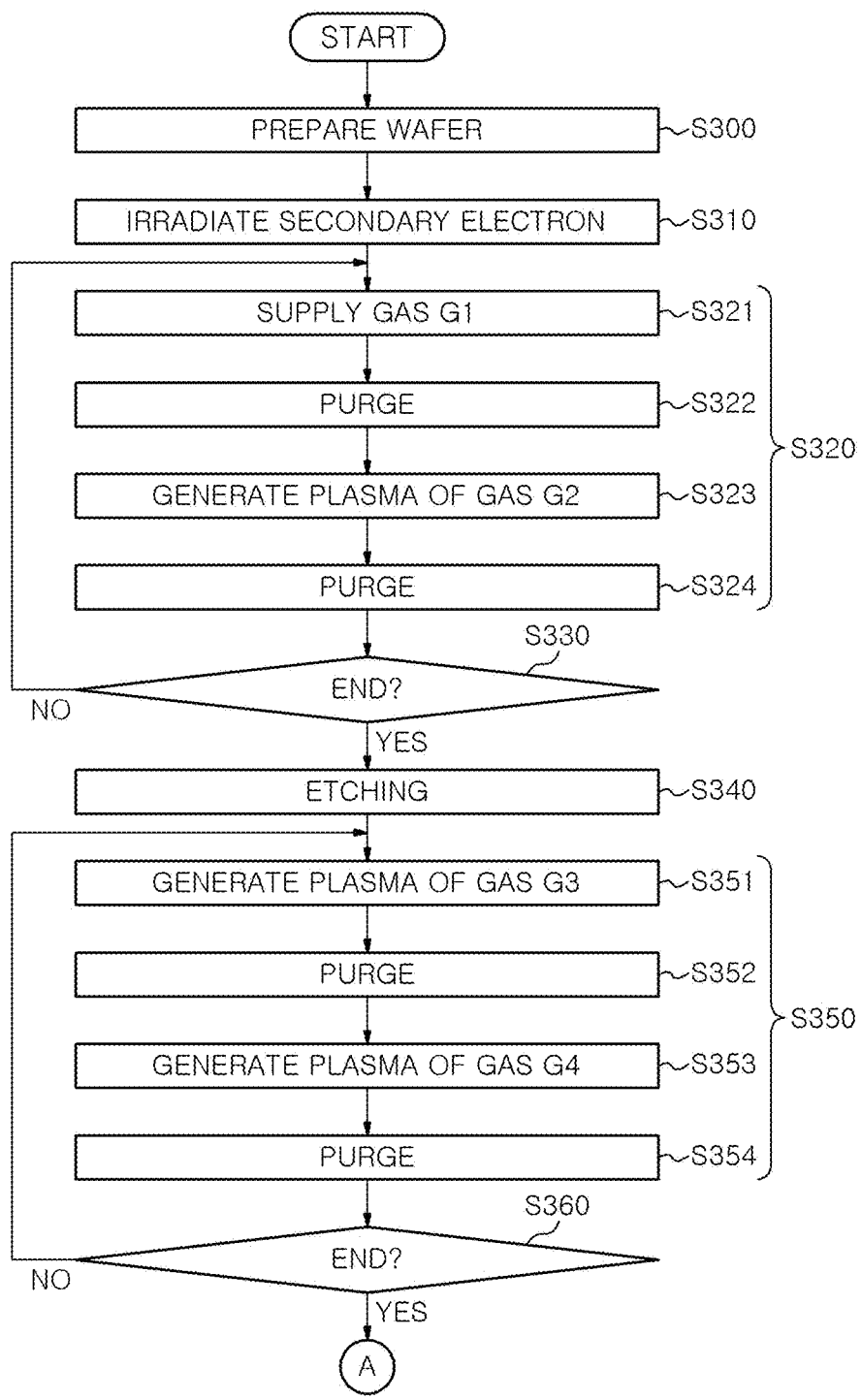
FIGS. 13A and 13B are flowcharts showing an example of plasma processing.
Figure 13B:
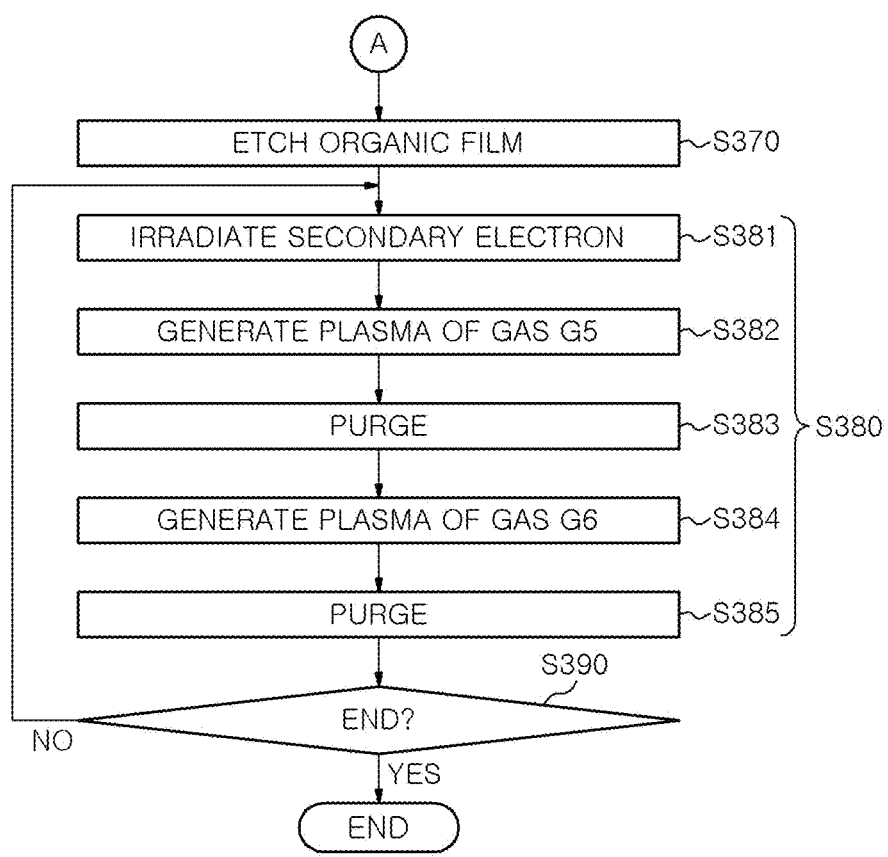
Figure 14A:
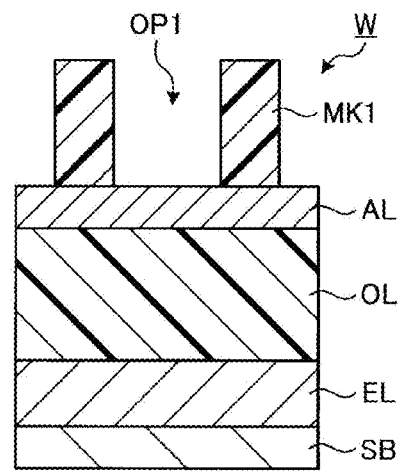
FIGS. 14A to 14F are cross sectional views showing examples of states of a wafer in respective steps.
Figure 14B:
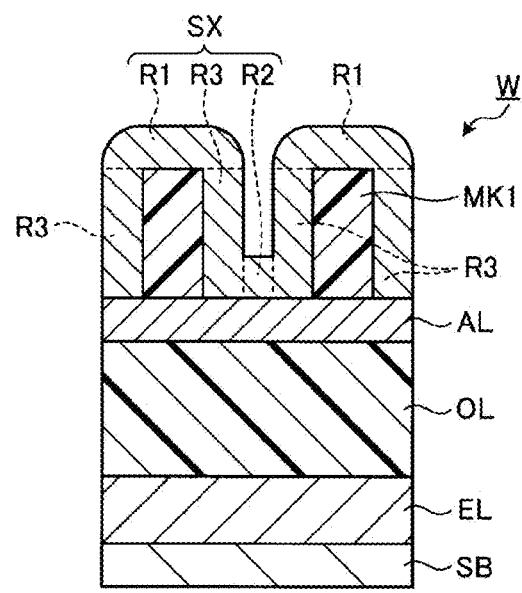
Figure 14C:
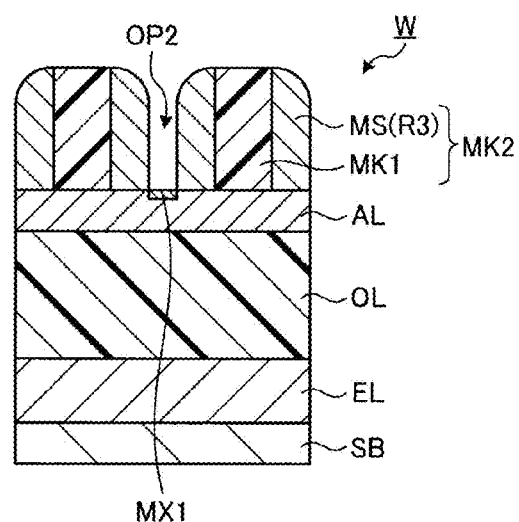
Figure 14D:
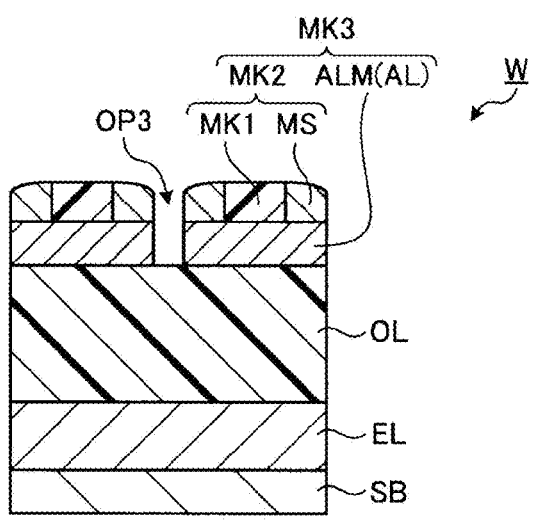
Figure 15A:
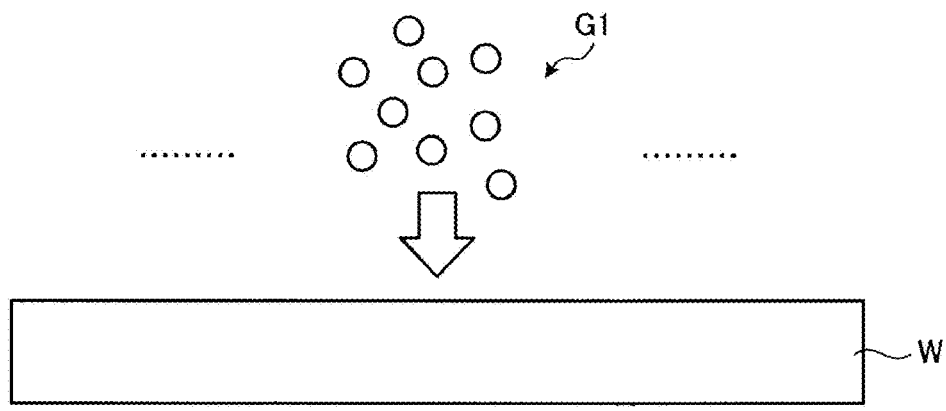
FIGS. 15A to 15C schematically show an example of a protective film forming process.
Figure 15B:
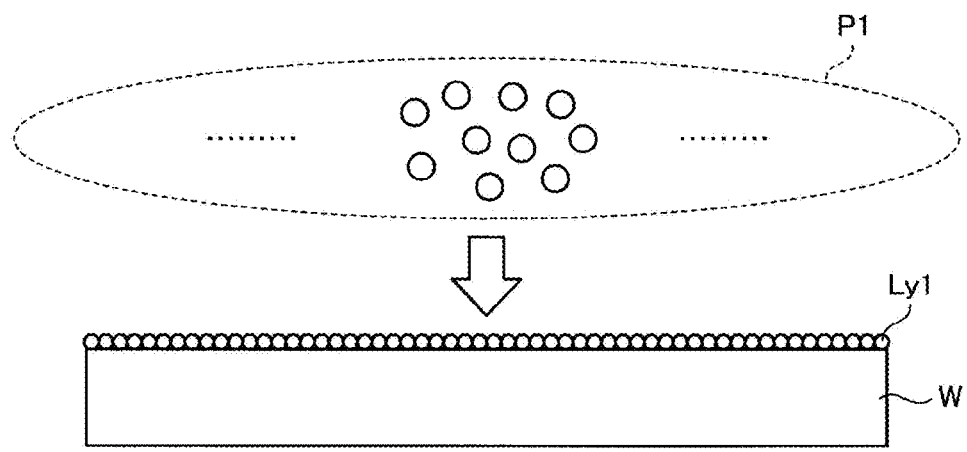
Figure 15C:
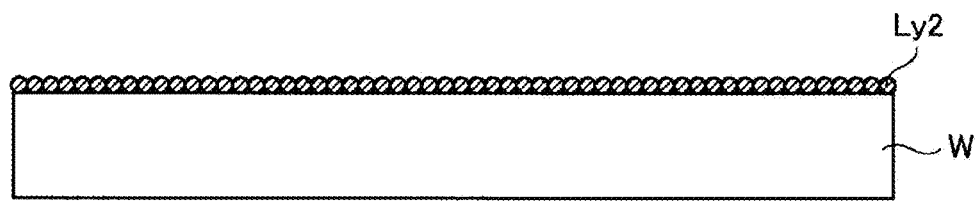
Figure 16A:
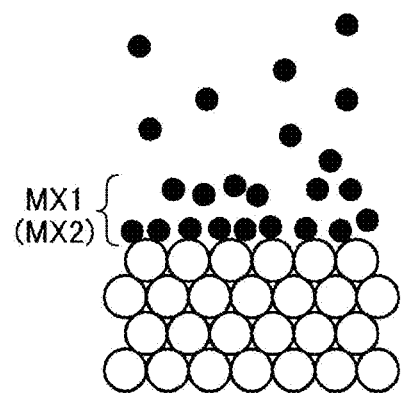
FIGS. 16A to 16C schematically show the principle of etching.
Figure 16B:
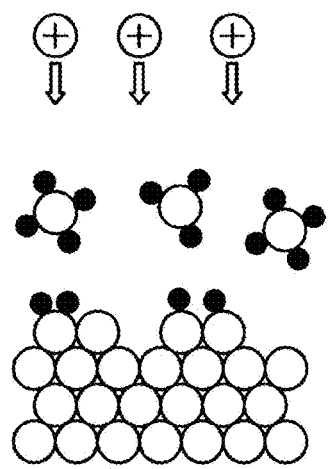
Figure 16C:
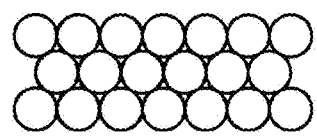

FIGS. 13A and 13B are flowcharts showing an example of plasma processing. In the following description with reference to FIGS. 13A and 13B, FIGS. 14A to 14F, 15A to 15C, and 16A to 16C will be appropriately referred to. FIGS. 14A to 14F are cross sectional views showing examples of the states of the wafer W in the respective steps. FIGS. 15A to 15C schematically show an example of a process of forming a protective film. FIGS. 16A to 16C schematically show the principle of etching.

First, a wafer W to be processed is prepared (step S300). In the step S300, a wafer W having a cross sectional structure shown in FIG. 14A, for example, is prepared. The wafer W is loaded into the processing chamber 20 of the plasma processing apparatus 10 and mounted on the electrostatic chuck ESC. As shown in FIG. 14A, for example, the wafer W includes a substrate SB, an etching target layer EL, an organic film OL, an anti-reflection film AL, and a mask MK1. The etching target layer EL is provided on the substrate SB. The etching target layer EL is made of a material that is selectively etched with respect to the organic film OL. The etching target layer EL is, e.g., an insulating film. The etching target layer EL may be made of, e.g., silicon oxide ($SiO_2$). The etching target layer EL may be made of another material such as polycrystalline silicon.

The organic film OL is provided on the etching target layer EL. The organic film OL is a layer containing carbon, e.g., an SOH (spin-on hard mask) layer. The anti-reflection film AL contains silicon and is provided on the organic film OL.

The mask MK1 is provided on the anti-reflection film AL. The mask MK1 is a resist mask made of a resist material and formed by patterning a resist layer by photolithography. The mask MK1 may be, e.g., an ArF resist. The mask MK1 partially covers the anti-reflection film AL. The mask MK1 defines an opening OP1 through which the anti-reflection film AL is partially exposed. The mask MK1 has, e.g., a line and space pattern, but may have other patterns such as a pattern that defines a circular opening when viewed from the top, a pattern that defines an elliptical opening when viewed from the top, and the like.

The mask MK1 may be, e.g., a block copolymer such as polystyrene-block-polymethyl methacrylate (PS-b-PMMA) or the like, or may be formed by using the phase-separated structure of PS and PMMA.

Returning back to FIGS. 13A and 13B, the description will be continued. Hereinafter, FIGS. 14A to 14F and 15A to 15C will be referred to together with FIGS. 13A and 13B. FIGS. 14A to 14F are cross sectional views showing examples of the states of the wafer W in the respective steps. FIGS. 15A to 15C schematically show an example of a process of forming a protective film.

After the step S300 is executed, secondary electrons are irradiated to the wafer W (step S310). In the step S310, the secondary electrons are irradiated to the mask MK1 by generating plasma in the processing chamber 20 and applying a negative DC voltage to the upper electrode 30 before the execution of steps S320 and S330. In the step S320, a protective film SX of silicon oxide is conformally formed on the mask MK1. By irradiating the secondary electrons to the mask MK1 before the execution of the steps S320 and S330 in which the protective film SX is formed, the mask MK1 can be modified before the formation of the protective film SX.

The processing in the step S310 will be described in detail. First, a hydrogen-containing gas and a rare gas are supplied into the processing chamber 20, and the high frequency power is supplied from the first high frequency power supply 62, thereby generating plasma in the processing chamber 20. The hydrogen-containing gas and the rare gas are supplied from the gas source GS into the processing chamber 20 through the piping system 12. Then, positive ions in the processing space S are attracted to the upper electrode 30 and collide with the upper electrode 30, so that secondary electrons are released from the upper electrode 30. By irradiating the released secondary electrons to the wafer W, the mask MK1 is modified.

Due to the collision between the positive ions and the electrode plate 34, silicon forming the electrode plate 34 is released together with the secondary electrons. The released silicon is bonded with oxygen released from the components of the plasma processing apparatus 10 that are exposed to the plasma. The oxygen is released from the components, e.g., the supporting member 21, the insulating member 32, and the temperature sensor 46. The bonding between silicon and oxygen leads to the formation of a silicon oxide compound. The silicon oxide compound is deposited on the wafer W and, thus, the mask MK1 is covered. Then, the processing space S in the processing chamber 20 is purged.

After the step S310 is executed, the steps S320 and S330 are sequentially executed. In the steps S320 and S330, the protective film SX of silicon oxide is conformally formed on the surface of the mask MK1. After the step S310 is executed, the step S320 is executed more than once. In the steps S320 and S330, the protective film SX of silicon oxide is conformally formed with a uniform thickness on the wafer W by a method such as an ALD (Atomic Layer Deposition) method. The step S320 includes steps S321, S322, S323, and S324.

In the step S320, first, a gas G1 is supplied into the processing chamber 20 (S321). In the step S321, the gas G1 containing silicon is introduced into the processing chamber 20 as shown in FIG. 15A, for example. The gas G1 includes an aminosilane-based gas containing a metal organic compound. As for the aminosilane-based gas containing the metal organic compound, monoaminosilane (H3-Si—R (R being an amino group containing an organic group) is used, for example. The gas G1 is supplied from the gas source GS into the processing chamber 20 through the piping system 12. In the step S321, plasma of the gas G1 is not generated.

The molecules of the gas G1 are adhered as reaction precursors (layer Ly1) to the surface of the wafer W as shown in FIG. 15B, for example. The molecules of the gas G1 (monoaminosilane) are adhered to the surface of the wafer W by chemical adsorption based on chemical bonding, and plasma is not used. In the step S321, the temperature of the wafer W is within a range from 0° C. to 20° C. It is also possible to use gases other than monoaminosilane as long as they contain silicon and can be adhered to the surface by chemical bonding within the above temperature range.

Next, the processing space S in the processing chamber 20 is purged (step S322). Specifically, the gas G1 supplied in the step S321 is exhausted. In the step S322, an inert gas such as a nitrogen gas or a rare gas (e.g., Ar) may be supplied as a purge gas into the processing chamber 20. In other words, the purge in the step S322 may be performed by supplying an inert gas into the processing chamber 20 or by vacuum evacuation. In the step S322, molecules excessively adhered on the wafer W can be removed. Accordingly, the layer Ly1 of the reaction precursor becomes an extremely thin monolayer.

Next, plasma P1 of a gas G2 is generated in the processing chamber 20 (step S323). The gas G2 includes a gas containing oxygen atoms and carbon atoms, e.g., a carbon dioxide gas. In the step S323, the temperature of the wafer W during the generation of the plasma P1 of the gas G2 is within a range from 0° C. to 20° C. The gas G2 is supplied from the gas source GS into the processing chamber 20 through the piping system 12. Then, the high frequency power is supplied from the first high frequency power supply 62, and the high frequency bias power is supplied from the second high frequency power supply 64. By operating the gas exhaust unit 50, the pressure in the processing chamber 20 is set to a predetermined pressure. In this manner, the plasma P1 of the gas G2 is generated in the processing chamber 20.

As shown in FIG. 15B, for example, when the plasma P1 of the gas G2 is generated, active species of oxygen and active species of carbon, e.g., oxygen radicals and carbon radicals, are generated. Then, as shown in FIG. 15C, for example, a layer Ly2 (corresponding to the protective film SX) that is a silicon oxide film is formed as a monolayer. Since the carbon radicals have a function of suppressing oxygen erosion to the mask MK1, the silicon oxide film can be stably formed as a protective film on the surface of the mask MK1. The binding energy of the Si—O bond of the silicon oxide film is about 192 kcal, which is higher than those of the C—C bond, the C—H bond, and the C—F bond. Therefore, the silicon oxide film can serve as a protective film. The binding energy of the C—C bond is about 50 to 110 kcal; the binding energy of the C—H bond is about 70 to 110 kcal; and the binding energy of the C—F bond is about 100 to 120 kcal.

Next, the space in the processing chamber 20 is purged (step S324). Specifically, the gas G2 supplied in the step S323 is exhausted. In the step S324, an inert gas such as a nitrogen gas or a rare gas (e.g., Ar) may be supplied as a purge gas to the processing chamber 20. In other words, the purge in the step S324 may be performed by supplying an inert gas into the processing chamber 20 or by vacuum evacuation.

Next, it is determined whether or not the execution of the step S320 is terminated (step S330). In the step S330, it is determined whether or not the number of executions of the step S320 has reached a preset number. The number of executions of the step S320 corresponds to the thickness of the protective film SX formed on the wafer W shown in FIG. 14B, for example. In other words, the thickness of the protective film SX finally formed on the wafer W can be substantially determined by multiplying the number of executions of the step S320 by the film thickness of the silicon oxide film formed by executing the step S320 once (unit cycle). Therefore, the number of executions of the step S320 can be set depending on a desired thickness of the protective film SX formed on the wafer W. By repeating the step S320, the protective film SX that is a silicon oxide film is conformally formed on the surface of the mask MK1.

If it is determined in the step S330 that the number of executions of the step S320 has not reached the preset number (step S330: No), the step S320 is executed again. On the contrary, if it is determined in the step S330 that the number of executions of the step S320 has reached the preset number (step S330: Yes), the execution of the step S320 is terminated. Accordingly, a protective film SX that is a silicon oxide film is formed on the surface of the wafer W as shown in FIG. 14B, for example. In other words, by repeating the step S320 a preset number of times, the protective film SX having a preset film thickness is conformally formed with a uniform thickness regardless of the density of the mask MK1 on the surface of the wafer W. By repeating the step S320, the thickness of the protective film SX provided on the mask MK1 is precisely controlled.

As shown in FIG. 14B, for example, the protective film SX formed by the steps S320 and S330 includes regions R1, R2, and R3. The region R3 extends along a side surface of the mask MK1. The region R3 extends from a surface of the anti-reflection film AL to a position beneath the region R1. The region R1 extends on the upper surface of the mask MK1 and on the region R3. The region R2 extends on a surface of the anti-reflection film AL between the adjacent regions R3. In the step S320, the protective film SX is formed by the ALD method. Therefore, the film thicknesses of the regions R1 to R3 are substantially the same regardless of the density of the mask MK1.

Next, the protective film SX is etched back such that the regions R1 and R2 are removed (step S340). In order to remove the regions R1 and R2, anisotropic etching conditions are required. Therefore, in the step S340, a processing gas containing a fluorocarbon-based gas ($C_xF_y$ gas (x and y being integers of 1 to 10)) is supplied into the processing chamber 20 from the gas source GS. The fluorocarbon-based gas may be, e.g., $CF_4$, $C_4F_8$, $CHF_3$ or the like. Then, the high frequency power is supplied from the first high frequency power supply 62, and the high frequency bias power is supplied from the second high frequency power supply 64. By operating the gas exhaust unit 50, the pressure in the space in the processing chamber 20 is set to a predetermined pressure. The pressure in the processing chamber 20 is preferably, e.g., 20 mT or less. Accordingly, the mean free path of active species such as ions and radicals in the plasma increases, and anisotropic etching is promoted.

In this manner, plasma of the fluorocarbon gas is generated. The active species containing fluorine in the generated plasma are attracted in a vertical direction by the high frequency bias power, so that the regions R1 and R2 are preferentially etched. As a result, the regions R1 and R2 are selectively removed, and a mask MS is formed by the remaining region R3 as shown in FIG. 14C, for example.

The masks MS and MK1 form a mask MK2 on the surface of the anti-reflection film AL.

Next, steps S350 and S360 are executed. In the steps S350 and S360, the anti-reflection film AL is etched.

After the step S340 is executed, the step S350 is executed more than once. In the step S350, a region of the anti-reflection film AL that is not covered with the mask MK2 is precisely etched with a high selectivity regardless of the density of the mask MK2 by a method like an atomic layer etching (ALE) method. The step S350 includes steps S351, S352, S353, and S354.

In the step S350, first, plasma of a gas G3 is generated in the processing chamber 20 (step S351). A mixed layer MX1 containing radicals in the plasma is formed at an atomic layer on the surface of the anti-reflection film AL. In the step S351, in a state where the wafer W mounted on the electrostatic chuck ESC, the gas G3 is supplied into the processing chamber 20, and plasma of the gas G3 is generated. The gas G3 is an etchant gas suitable for the etching of the anti-reflection film AL containing silicon. The gas G3 contains a fluorocarbon-based gas and a rare gas. The gas G3 may be, e.g., $C_xF_y$/Ar gas. $C_xF_y$ may be $CF_4$. The gas G3 is supplied from the gas source GS into the processing chamber 20 via the piping system 12. Then, the high frequency power is supplied from the first high frequency power supply 62, and the high frequency bias power is supplied from the second high frequency power supply 64. By operating the gas exhaust unit 50, the pressure in the space in the processing chamber 20 is set to a predetermined pressure. Accordingly, the plasma of the gas G3 is generated in the processing chamber 20. The plasma of the gas G3 contains carbon radicals and fluorine radicals.

FIGS. 16A to 16C schematically show the principle of the etching. In FIGS. 16A to 16C, white dots indicate atoms forming the anti-reflection film AL, and black dots indicate radicals. In FIGS. 16A to 16C, "+" surrounded by a circle indicates ions of atoms of a rare gas (e.g., ions of Ar atoms) contained in a gas G4 to be described later. As shown in FIGS. 14C and 16A, for example, carbon radicals and fluorine radicals contained in the plasma of the gas G3 are supplied to the surface of the anti-reflection film AL by executing the step S351. By executing the step S351, the mixed layer MX1 containing atoms forming the anti-reflection film AL, carbon radicals and fluorine radicals is formed on the surface of the anti-reflection film AL.

Since the gas G3 contains a fluorocarbon-based gas, fluorine radicals and carbon radicals are supplied to the atomic layer on the surface of the anti-reflection film AL, and the mixed layer MX1 containing both of the fluorine radicals and carbon radicals can be formed at the atomic layer in the step S351.

In the mask MK1 of the ArF resist, Si of the mask MS included in the mask MK2 or the carbon radical contained in the plasma of the gas G3 function as a protective film. The amount of fluorine radicals can be controlled by a DC voltage applied from the power supply 70.

Next, the space in the processing chamber 20 is purged (step S352). In the step S352, the gas G3 supplied in the step S351 is exhausted. In the step S352, an inert gas such as a nitrogen gas or a rare gas (e.g., Ar gas) may be supplied as a purge gas to the processing chamber 20. In other words, purge in the step S352 may be performed by supplying an inert gas into the processing chamber 20 or by vacuum evacuation.

Next, plasma of the gas G4 is generated in the processing chamber 20, a bias voltage is applied to the plasma to remove the mixed layer MX1 (step S353). The gas G4 may include a rare gas, e.g., Ar gas or the like. The gas G4 is supplied from the gas source GS to the processing chamber 20 through the piping system 12. The high frequency power is supplied from the first high frequency power supply 62, and the high frequency bias power is supplied from the second high frequency power supply 64. By operating the gas exhaust unit 50, a pressure in the space in the processing chamber 20 is set to a predetermined pressure. As a result, the plasma of the gas G4 is generated in the processing chamber 20.

Ions of atoms of the gas G4 (e.g., ions of Ar atoms) in the generated plasma are attracted in a vertical direction by the high frequency bias power and collide with the mixed layer MX1 on the surface of the anti-reflection film AL, thereby supply energy to the mixed layer MX1. In the step S353, the energy is supplied to the mixed layer MX1 formed on the surface of the anti-reflection film AL through the ions of the atoms of the gas G4 as shown in FIG. 16B, for example, and the mixed layer MX1 can be removed from the anti-reflection film AL by the energy.

Next, the space in the processing chamber 20 is purged (step S354). In the step S354, the gas G4 supplied in the step S353 is exhausted. In the step S354, an inert gas such as a nitrogen gas or a rare gas (e.g., Ar gas) may be supplied as a purge gas to the processing chamber 20. In other words, the purge in the step S354 may be performed by supplying an inert gas into the processing chamber 20 or by vacuum evacuation. Due to the purge in the step S354, atoms forming the mixed layer MX1 on the surface of the anti-reflection film AL and excessive ions (e.g., ions of Ar atoms) in the plasma can be sufficiently removed as shown in FIG. 16C, for example.

Next, it is determined whether or not the execution of the step S350 is terminated (step S360). In the step S360, it is determined whether or not the number of executions of the step S350 has reached a preset number. The number of executions of the step S350 corresponds to degree (depth) of etching with respect to the anti-reflection film AL. The step S350 may be repeatedly performed to etch the anti-reflection film AL down to the surface of the organic film OL. In other words, the number of executions of the step S350 can be determined such that the product of the thickness of the anti-reflection film AL etched by executing the step S350 once (unit cycle) and the number of executions of the step S350 becomes the thickness of the anti-reflection film AL. Therefore, the number of executions of the step S350 can be set depending on the thickness of the anti-reflection film AL.

If it is determined that the number of executions of the step S350 has not reached the preset number (step S360: No), the step S350 is executed again. On the contrary, if it is determined that the number of executions of the step S350 has reached the preset number (step S360: Yes), the execution of the step S350 is terminated. Accordingly, as shown in FIG. 14D, for example, the anti-reflection film AL is etched and a mask ALM is formed. In other words, by repeating the step S350 a preset number of times, the anti-reflection film AL is uniformly etched by the same width as that of the opening OP2 provided by the mask MK2 regardless of the density of the mask MK2 (density of the mask MK1), and the selectivity is improved.

The mask ALM and the mask MK2 define an opening OP3. The width of the opening OP3 is substantially the same as the width of the opening OP2 provided by the mask MK2 (see FIG. 14C). The mask MK2 and the mask ALM form a mask MK3 for the organic film OL. The width of the opening OP3 formed by etching of the anti-reflection film AL is precisely controlled by repeating the step S350.

Due to the series of processes from the step S310 to the step S340, a silicon oxide film is uniformly formed with a precisely controlled film thickness on the side surface of the mask MK2 on the anti-reflection film AL. Accordingly, it is possible to reduce the influence on the shape (line width roughness (LWR) and line edge roughness (LER)) of the mask MK2 by the etching in the step S350 on the anti-reflection film AL. Since the influence of the etching in the step S350 on the shape of the mask MK2 can be reduced, it is also possible to reduce the influence of the etching in the step S350 on the width of the opening OP3 formed by the etching and the influence of the density of the mask MK2 (the density of the mask MK1) on the width of the opening OP3 formed by the etching.

Next, the organic film OL is etched using the mask MK3 (step S370). In the step S370, the organic film OL is etched using the mask MK3 by the plasma generated in the processing chamber 20 after the execution of the steps S350 and S360 in which the anti-reflection film AL is etched. The mask MK3 is formed from the anti-reflection film AL in the step of etching the anti-reflection film AL (steps S350 and S360).

In the step S370, first, a processing gas containing a nitrogen gas and a hydrogen-containing gas is supplied from the gas source GS through the piping system 12 into the processing chamber 20. The processing gas may contain oxygen. The high frequency power is supplied from the first high frequency power supply 62, and the high frequency bias power is supplied from the second high frequency power supply 64. By operating the gas exhaust unit 50, the pressure in the space in the processing chamber 20 is set to a predetermined pressure. Accordingly, plasma of the processing gas containing a nitrogen gas and a hydrogen-containing gas is generated. Hydrogen radicals that are active species of hydrogen in the generated plasma etch a region exposed through the mask MK3 in the entire region of the organic film OL.

Figure 14E:
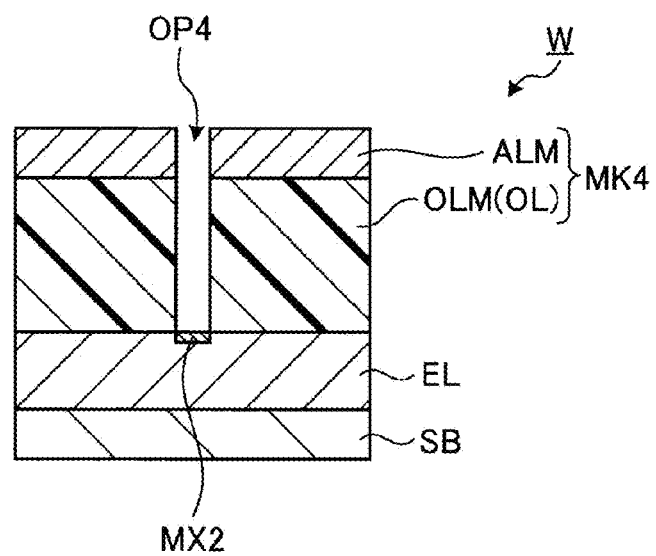

Accordingly, as shown in FIG. 14E, for example, the organic film OL is etched, and a mask OLM having an opening OP4 with the same width as the width (see FIG. 14D) of the opening OP3 provided by the mask MK3 is formed from the organic film OL. The mask ALM and mask OLM form a mask MK4 for the etching target layer EL. In the step S350, the uniformity of the width of the opening OP3 of the mask MK3 is improved regardless of the density of mask MK3 (density of mask MK2) and the shape (LWR and LER) of mask MK3 is also improved. Therefore, the uniformity of the width of the opening OP4 of the mask MK4 is improved regardless of the density of the mask MK4 (the density of the mask MK3), and the shape (LWR and LER) of the mask MK4 is also improved.

Next, the etching target layer EL is etched by removing each atomic layer from the etching target layer EL (step S380). The step S380 includes steps S381, S382, S383, S384, and S385.

In the step S380, first, secondary electrons are irradiated to the wafer W (step S381). In the step S381, the secondary electrons are irradiated to the mask MK4 by generating plasma in the processing chamber 20 and applying a negative DC voltage to the upper electrode 30 of the parallel plate electrodes provided in the processing chamber 20. Further, silicon is released from the silicon-containing electrode plate 34 of the upper electrode 30, and the mask MK4 is covered with a silicon oxide compound containing silicon. After the mask MK4 is covered with the silicon oxide compound, the space in the processing chamber 20 is purged.

In the step S381, plasma is generated in the processing chamber 20 by supplying a hydrogen-containing gas and a rare gas (e.g., Ar gas) into the processing chamber 20 and supplying the high frequency power from the first high frequency power supply 62. The hydrogen-containing gas and the rare gas (e.g., Ar gas) are supplied from the gas source GS into the processing chamber 20 through the piping system 12. Then, positive ions in the processing space S are attracted to the upper electrode 30 and collide with the upper electrode 30. Due to the collision between the positive ions and the upper electrode 30, secondary electrons are released from the upper electrode 30.

By irradiating the released secondary electrons to the wafer W, the mask MK1 is modified. Further, due to the collision between the positive ions and the electrode plate 34, silicon forming the electrode plate 34 is released together with the secondary electrons. The released silicon is bonded with oxygen released from the components of the plasma processing apparatus 10 that are exposed to the plasma. The oxygen is released from the components such as the supporting member 21, the insulating member 32, the temperature sensor 46, and the like. A silicon oxide compound is generated due to the bonding of silicon and oxygen and deposited on the wafer W. Accordingly, the mask MK4 is covered. Then, the processing chamber 20 is purged.

Next, in the same manner as that in the step S351, plasma of a gas G5 is generated in the processing chamber 20, and a mixed layer MX2 containing radicals in the plasma is formed at the atomic layer on the surface of the etching target layer EL (step S382). In the step S382, in a state where the wafer W is mounted on the electrostatic chuck ESC, the gas G5 is supplied into the processing chamber 20, and plasma of the gas G5 is generated. The gas G5 is an etchant gas suitable for the etching of the etching target layer EL, and contains a fluorocarbon-based gas and a rare gas. For example, the gas G5 may be a $C_xF_y$/Ar gas. $C_xF_y$ may be $CF_4$. The gas G5 is supplied from the gas source GS into the processing chamber 20 through the piping system 12.

Then, the high frequency power is supplied from the first high frequency power supply 62, and the high frequency bias power is supplied from the second high frequency power supply 64. By operating the gas exhaust unit 50, the pressure in the space in the processing chamber 20 is set to a predetermined pressure. Accordingly, plasma of the gas G5 is generated in the processing chamber 20. The plasma of gas G5 contains carbon radicals and fluorine radicals. In the step S382, the mixed layer MX2 containing carbon radicals and fluorine radicals is formed at the atomic layer on the surface of the etching target layer EL (see FIGS. 14E and 16A). Since the gas G5 contains a fluorocarbon-based gas, fluorine radicals and carbon radicals are supplied to the atomic layer on the surface of the etching target layer EL, and the mixed layer MX2 containing both of the fluorine radicals and the carbon radicals can be formed at the atomic layer in the step S381.

Next, the space in the processing chamber 20 is purged by the same method as that in the step S352 (step S383). In the step S383, the gas G5 supplied in the step S382 is exhausted. In the step S383, an inert gas such as a nitrogen gas or a rare gas (e.g., Ar gas) may be supplied as a purge gas to the processing chamber 20. In other words, the purge in the step S383 may be performed by supplying an inert gas into the processing chamber 20 or by vacuum evacuation.

Next, plasma of a gas G6 is generated in the processing chamber 20 in the same manner as that in the step S353, and a bias voltage is applied to the plasma to remove the mixed layer MX2 (step S384). The gas G6 contains a rare gas, e.g., an Ar gas. The gas G6 is supplied from the gas source GS to the processing chamber 20 through the piping system 12. Then, the high frequency power is supplied from the first high frequency power supply 62, and the high frequency bias power is supplied from the second high frequency power supply 64. By operating the gas exhaust unit 50, the pressure in the space in the processing chamber 20 is set to a predetermined pressure. Accordingly, plasma of the gas G6 is generated in the processing chamber 20. Ions of atoms of the gas G6 in the generated plasma (e.g., ions of Ar atoms) are attracted in a vertical direction by the high frequency bias power and collide with the mixed layer MX2 on the surface of the etched layer EL, thereby supplying energy to the mixed layer MX2. As shown in FIG. 16B, for example, in the step S382, the energy is supplied to the mixed layer MX2 formed on the surface of the etching target layer EL through the ions of the atoms of the gas G6, and the mixed layer MX2 can be removed from the etching target layer MX2 by the energy.

Next, the space in the processing chamber 20 is purged by the same method as that in the step S354 (step S385). In the step S385, the gas G6 supplied in the step S384 is exhausted. In the step S385, an inert gas such as a nitrogen gas or a rare gas (e.g., Ar gas) may be supplied as a purge gas to the processing chamber 20. In other words, the purge in the step S385 may be performed by supplying an inert gas into the processing chamber 20 or by vacuum evacuation. Due to the purge in the step S385, the atoms forming the mixed layer MX2 on the surface of the etching target layer EL and excessive ions (e.g., ions of Ar atoms) in the plasma can be sufficiently removed as shown in FIG. 16C, for example.

Next, it is determined whether or not the execution of step S380 is terminated by the same method as that in the step S360 (step S390). In the step S390, it is determined whether or not the number of executions of the step S380 has reached a preset number. The number of executions of the step S380 corresponds to the degree (depth) of etching with respect to the etching target layer EL. The step S380 can be repeatedly executed to etch the etching target layer EL up to the surface of the substrate SB. In other words, the number of executions of the step S380 (number of executions of the step S380) can be determined such that the product of the thickness of the etching target layer EL etched by executing the step S380 once (unit cycle) and the number of executions of the step S380 becomes the thickness of the etching target layer EL. Therefore, the number of executions of the step S380 can be set depending on the thickness of the etching target layer EL.

Figure 14F:
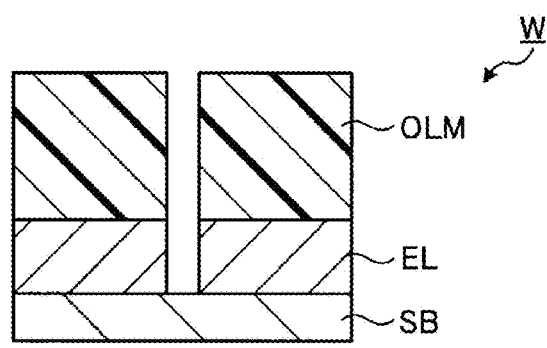

If it is determined in the step S390 that the number of executions of the step S380 has not reached the preset number (step S390: No), the step S380 is executed again. On the contrary, if it is determined in the step S390 that the number of executions of the step S380 has reached the preset number (step S390: Yes), the plasma processing shown in FIGS. 13A and 13B is terminated. Accordingly, the wafer W in which the etching target layer EL is etched is obtained as shown in FIG. 14F, for example.

(Film Removal Process)

Figure 17:
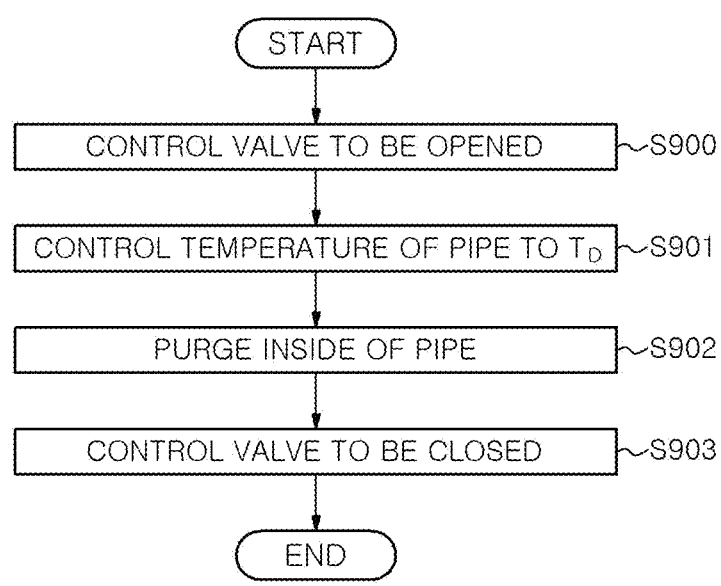
FIG. 17 is a flowchart showing an example of a film removal process.
Figure 18:
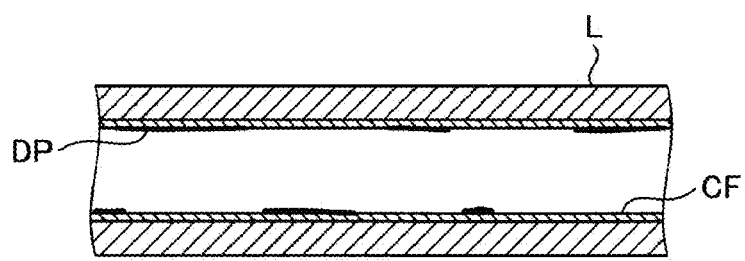
FIG. 18 shows an example of a cross section of a line to which deposits are adhered.
Figure 19:
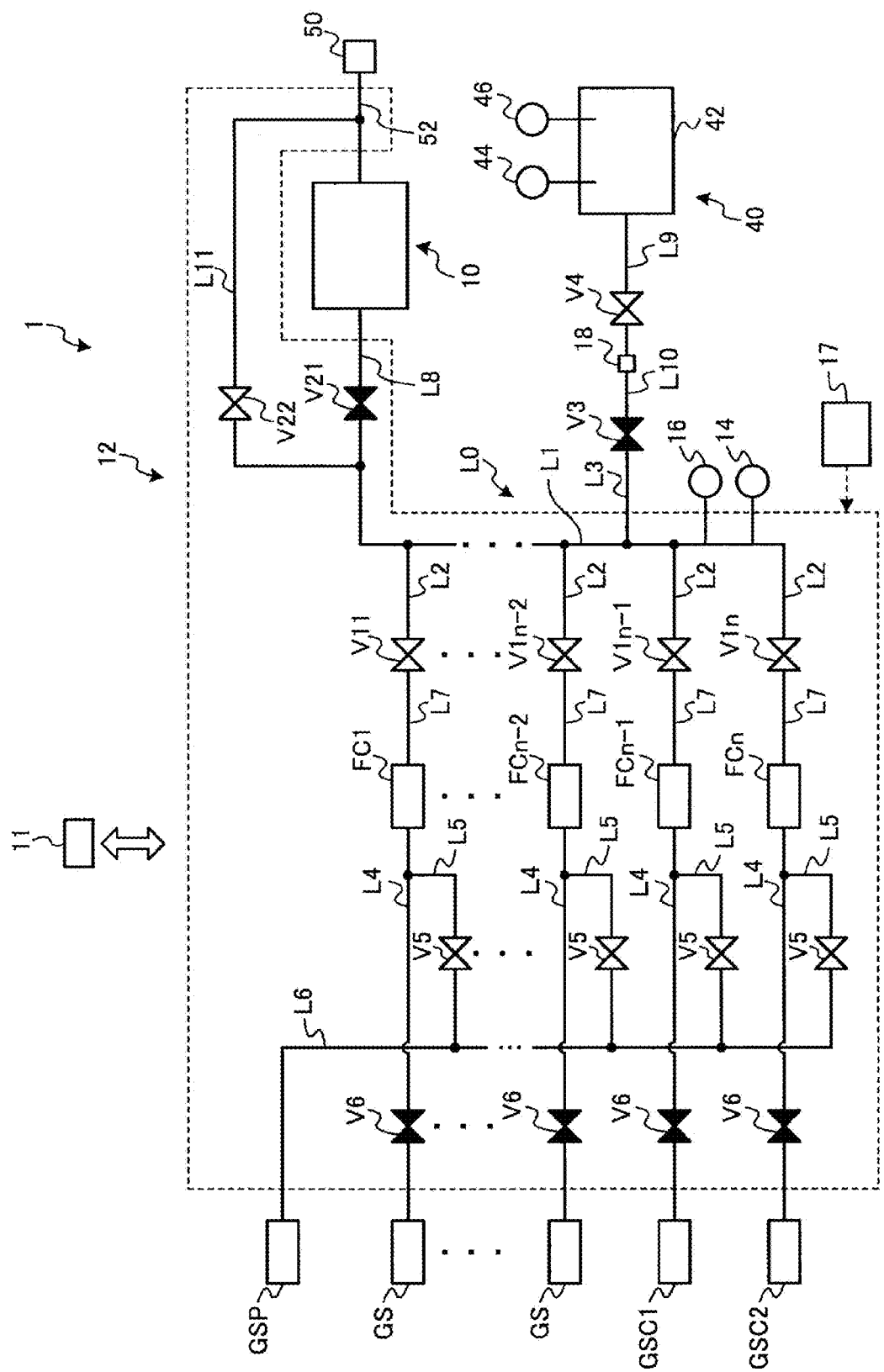
FIG. 19 schematically shows the states of the valves after execution of a step S900.

FIG. 17 is a flowchart showing an example of the film removal process (step S90). In the following description with reference to FIG. 17, FIGS. 18 and 19 will be appropriately referred to. FIG. 18 shows an example of a cross section of a pipe to which deposits are attached. FIG. 19 schematically shows the states of the valves after the execution of the step S900. When the plasma processing in the step S30 is executed, the deposits DP are adhered to the film CF formed in the pipe L by the film forming process in the step S10 as shown in FIG. 18, for example.

In the film removal process, first, a predetermined valve V is controlled to be opened (step S900). In the step S900, the valves V11 to V1n, V22, and V5 are controlled to be opened, and the valves V21, V3, and V6 are controlled to be closed as shown in FIG. 19, for example.

Next, the temperature control unit 17 controls the temperature of the piping system 12 to the predetermined temperature $T_D$ (S901). Then, the purge gas from the gas source GSP is supplied into the piping system 12, and the gas in the piping system 12 is exhausted by the gas exhaust unit 50, thereby purging the inside of the piping system 12 (S902). Then, the valves controlled to be opened in the step S900 are controlled to be closed (S903).

In the step S901, the temperature of the piping system 12 is controlled to the predetermined temperature $T_D$, so that the film CF formed on the inner wall of the pipe L or the like in the step S10 is depolymerized and peeled off from the inner wall of the pipe L or the like. At this time, the deposits DP adhered to the film CF are also peeled off from the inner wall of the pipe L or the like together with the film CF. Then, the film CF and the deposits DP are exhausted together with the purge gas supplied from the gas source GSP. Accordingly, the deposits DP in the pipe L are removed, and the state in the pipe L becomes the state shown in FIG. 7A, for example. Similarly, the deposits DP adhered to the flow rate controller FC or the valve V in the piping system 12 are removed together with the film CF. By removing the deposits DP in the piping system 12, the flow rate control accuracy of the flow rate controller FC is improved. Further, by removing the deposits DP in the piping system 12, the particle generation source is removed, and the wafer W can be prevented from being contaminated by particles.

Other Embodiments

The present disclosure is not limited to the above-described embodiments, and various modifications can be made within the scope of the gist of the present disclosure.

For example, in the above embodiment, the film forming process in the step S10 is performed once before the execution of the plasma processing in the step S30. However, the present disclosure is not limited thereto, and the film forming process in the step S10 may be performed twice or more before the plasma processing in the step S30.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A method for cleaning a gas supply line comprising:
   forming a film of a compound on an inner wall of a gas supply line by polymerization of a first compound and a second compound by controlling a temperature of the gas supply line to a first temperature at which the first compound and the second compound are polymerized in a state where a first gas containing the first compound and a second gas containing the second compound are supplied to the gas supply line; and
   removing the film by controlling the temperature of the gas supply line to a second temperature at which the film is depolymerized after predetermined processing is performed on a target object in a processing chamber by a processing gas supplied into the processing chamber through the gas supply line having the film,
   wherein the first compound is isocyanate,
   wherein the second compound is amine or a compound having a hydroxyl group, and
   wherein said forming the film includes:
   controlling the temperature of the gas supply line to the second temperature,
   supplying the first gas and the second gas into the gas supply line in a state where valves at both ends of the gas supply line are opened, wherein each of said valves can open or close the gas supply line, and
   forming the film of the compound on the inner wall of the gas supply line by controlling a temperature of the gas line to the first temperature in a state where the valves at both ends of the gas supply line are closed.

2. The method of claim 1, wherein said forming the film is executed multiple
   times before the predetermined processing is performed on the target object in the processing chamber by the processing gas supplied into the processing chamber through the gas supply line having the film.

3. The method of claim 1, wherein said forming a film is executed again after said removing the film.

4. The method of claim 1, wherein said forming a film is executed again after said removing the film.

* * * * *